(12) United States Patent
Unno et al.

(10) Patent No.: US 7,714,343 B2
(45) Date of Patent: May 11, 2010

(54) LIGHT EMITTING DEVICE

(75) Inventors: Tsunehiro Unno, Hitachi (JP);
Masahiro Arai, Hitachi (JP)

(73) Assignee: Hitachi Cable, Ltd., Tokyo (JP)

( * ) Notice: Subject to any disclaimer, the term of this patent is extended or adjusted under 35 U.S.C. 154(b) by 170 days.

(21) Appl. No.: 12/068,192

(22) Filed: Feb. 4, 2008

(65) Prior Publication Data
US 2009/0072257 A1    Mar. 19, 2009

(30) Foreign Application Priority Data
Sep. 18, 2007    (JP)    ............ 2007-241209

(51) Int. Cl.
*H01L 33/00*    (2006.01)
(52) U.S. Cl. ............... 257/98; 257/79; 257/99
(58) Field of Classification Search .......... 257/79, 257/98, 99, E33.011, E33.067
See application file for complete search history.

(56) References Cited

U.S. PATENT DOCUMENTS 6,784,462 B2    8/2004    Schubert 7,564,071 B2 *    7/2009    Konno ............ 257/98

FOREIGN PATENT DOCUMENTS

JP    6-82862    10/1994

\* cited by examiner

*Primary Examiner*—Phuc T Dang
(74) *Attorney, Agent, or Firm*—McGinn IP Law Group, PLLC

(57) ABSTRACT

An upper electrode is formed on one surface of a semiconductor multilayer structure including a light emitting layer. An interface electrode is formed at a region of another surface of the semiconductor multilayer structure except a region right under the upper electrode. A center of the interface electrode coincides with a center of the upper electrode. At least a part of the interface electrode has a similar shape to a shape of an outer periphery of the upper electrode. A current blocking layer is formed at another region of another surface of the semiconductor multilayer structure except the region where the interface electrode is formed. A reflecting layer for reflecting a part of the light emitted from the light emitting layer is electrically connected to the interface electrode. A conductive supporting substrate is electrically connected to the semiconductor multilayer structure.

6 Claims, 19 Drawing Sheets

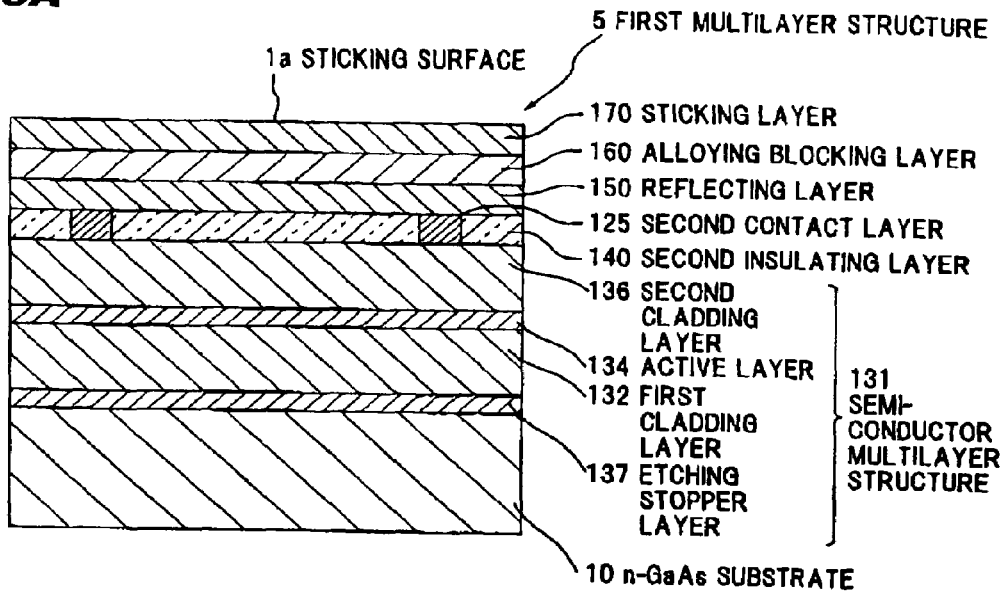
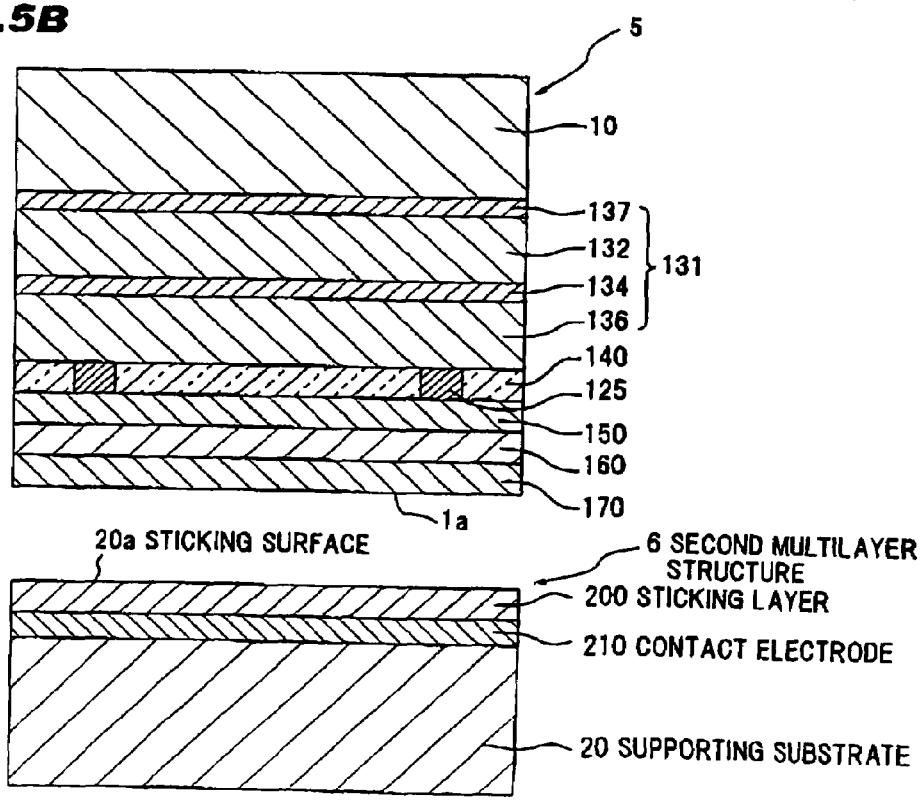

- 7a STUCK SUBSTRATE
- 10 n-GaAs SUBSTRATE
- 137 ETCHING STOPPER LAYER
- 132 FIRST CLADDING LAYER
- 134 ACTIVE LAYER
- 136 SECOND CLADDING LAYER
- 140 SECOND INSULATING LAYER
- 125 SECOND CONTACT LAYER
- 150 REFLECTING LAYER
- 160 ALLOYING BLOCKING LAYER
- 170 STICKING LAYER
- 200 STICKING LAYER
- 210 CONTACT ELECTRODE
- 20 SUPPORTING SUBSTRATE

- 7c STUCK SUBSTRATE
- 132 FIRST CLADDING LAYER
- 134 ACTIVE LAYER
- 136 SECOND CLADDING LAYER
- 140 SECOND INSULATING LAYER
- 125 SECOND CONTACT LAYER
- 150 REFLECTING LAYER
- 160 ALLOYING BLOCKING LAYER
- 170 STICKING LAYER
- 200 STICKING LAYER
- 210 CONTACT ELECTRODE
- 20 SUPPORTING SUBSTRATE

- 110 FIRST INSULATING LAYER
- 7d

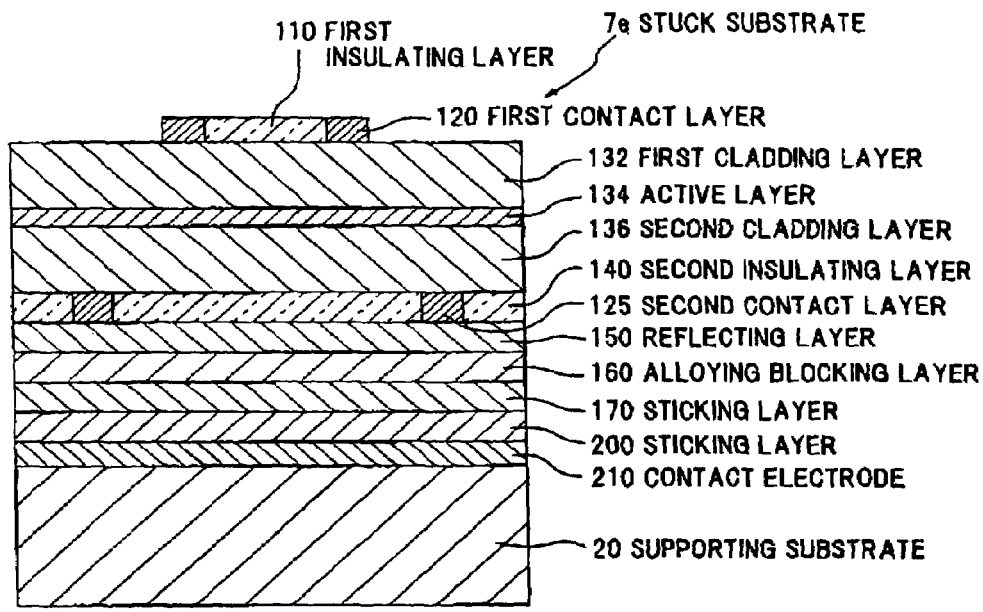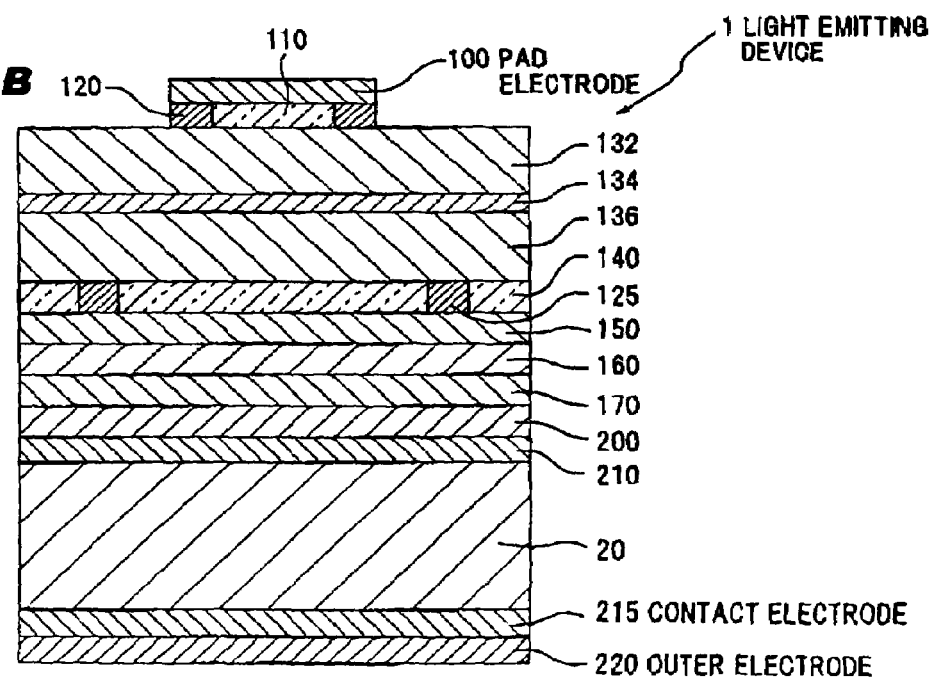

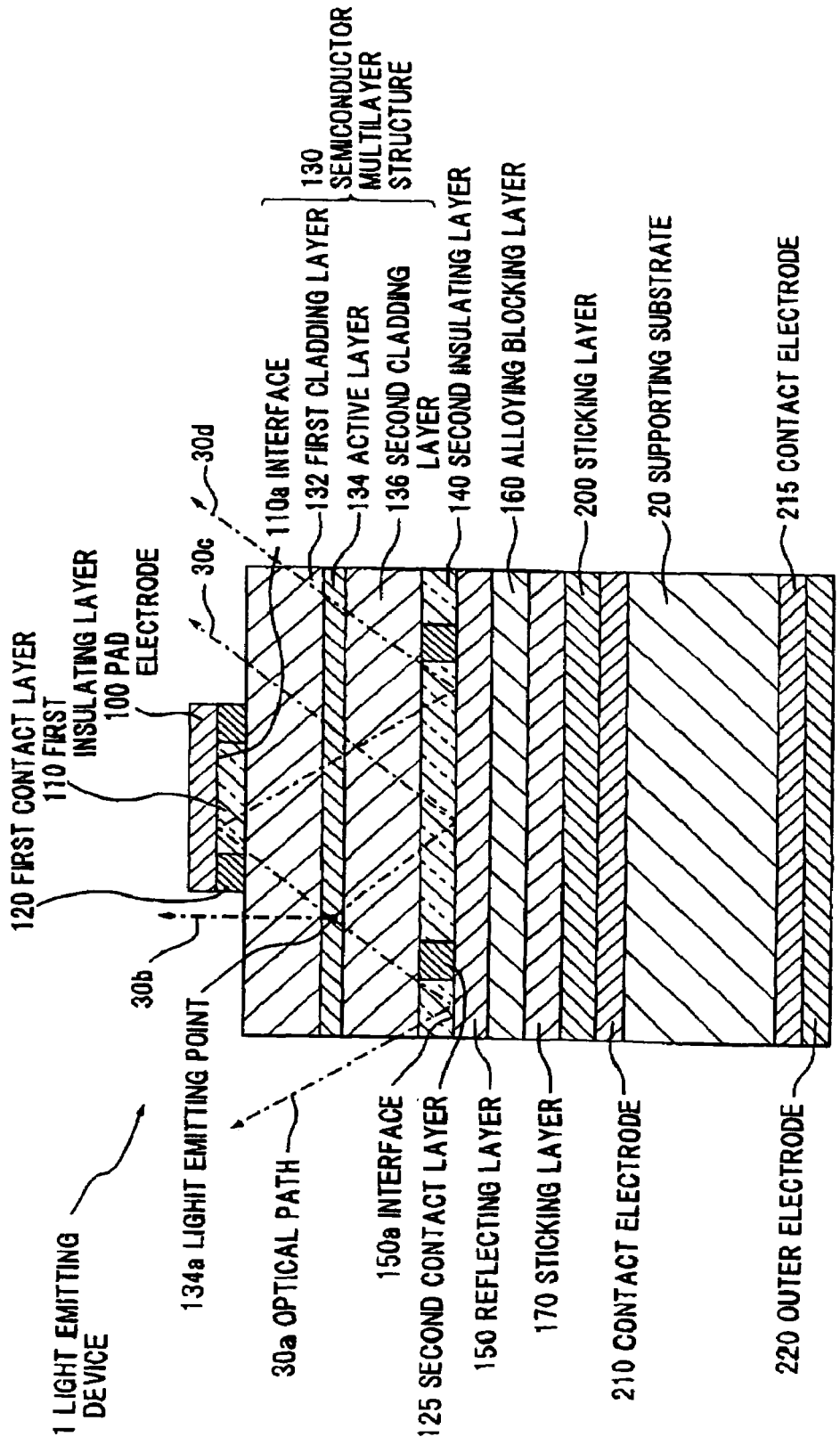

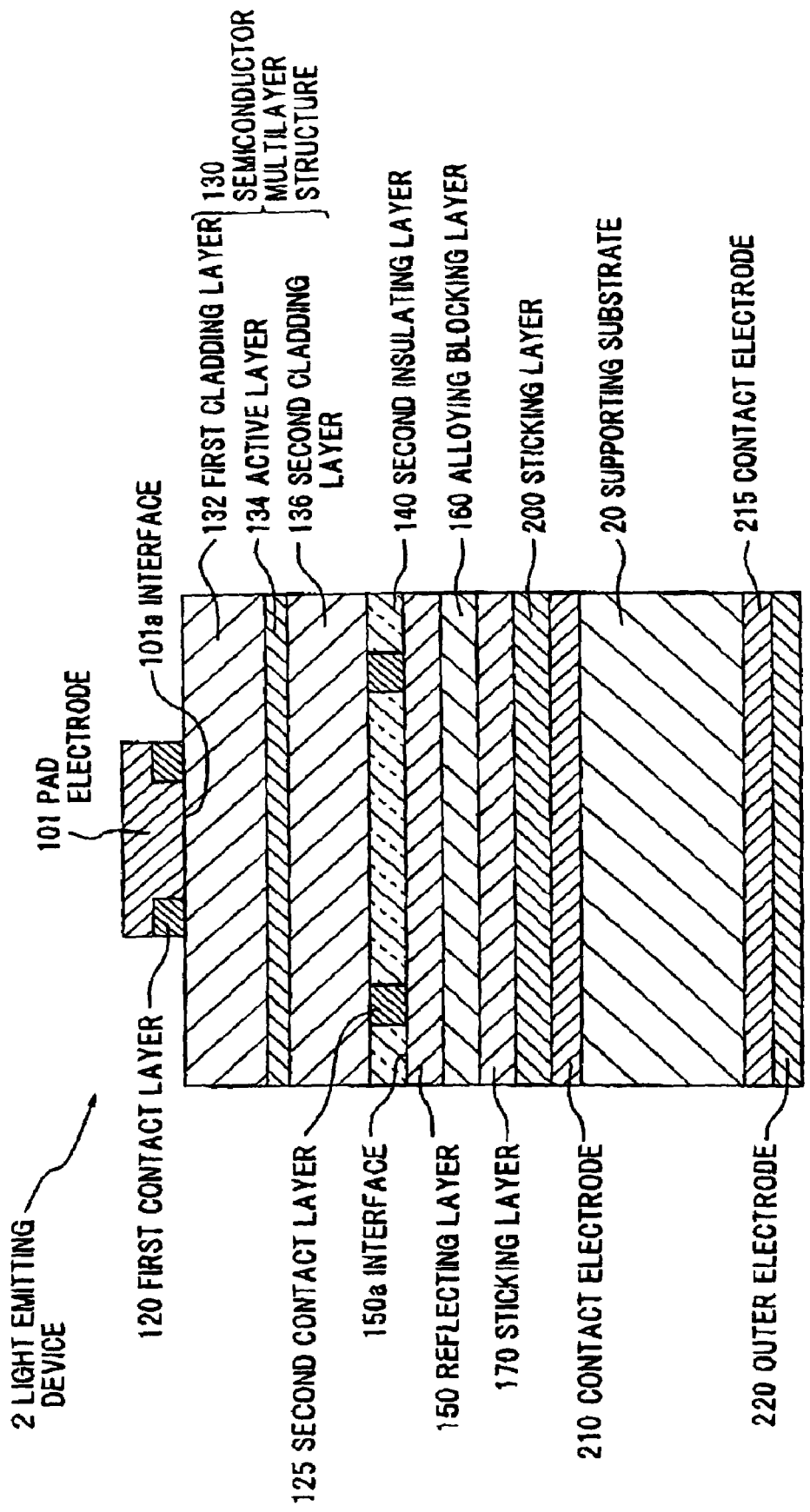

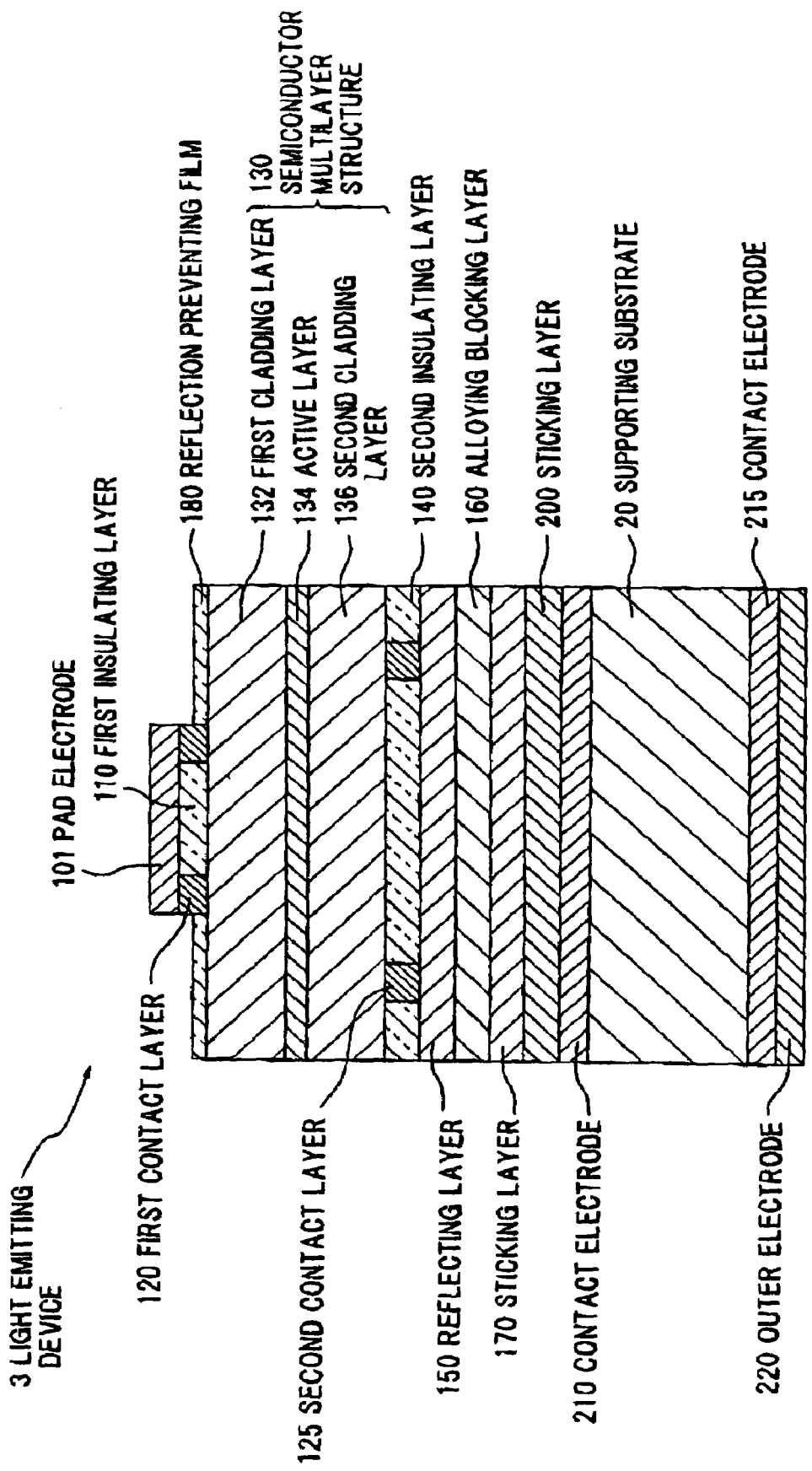

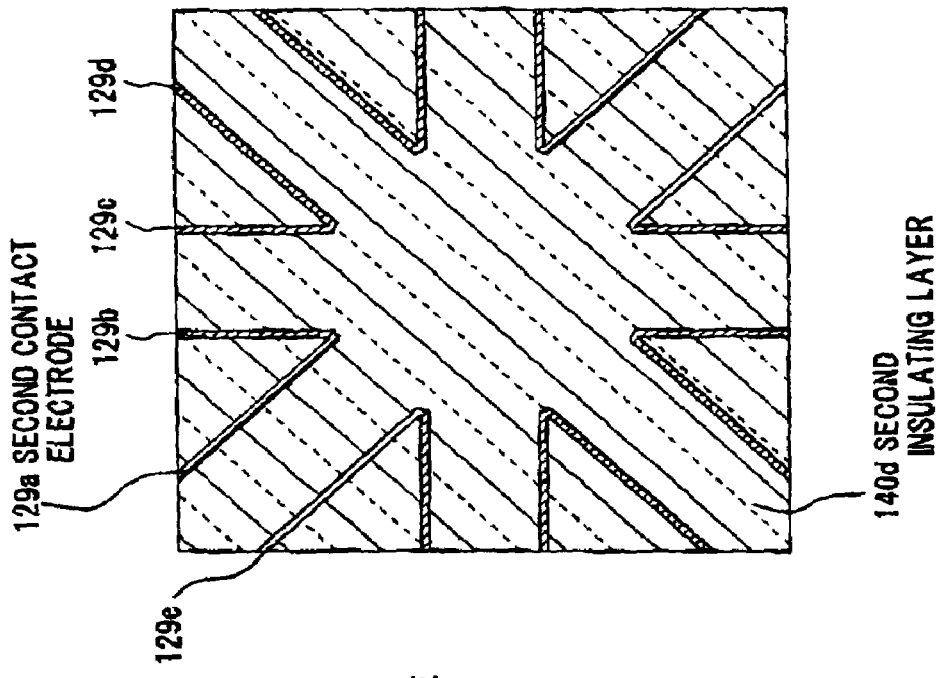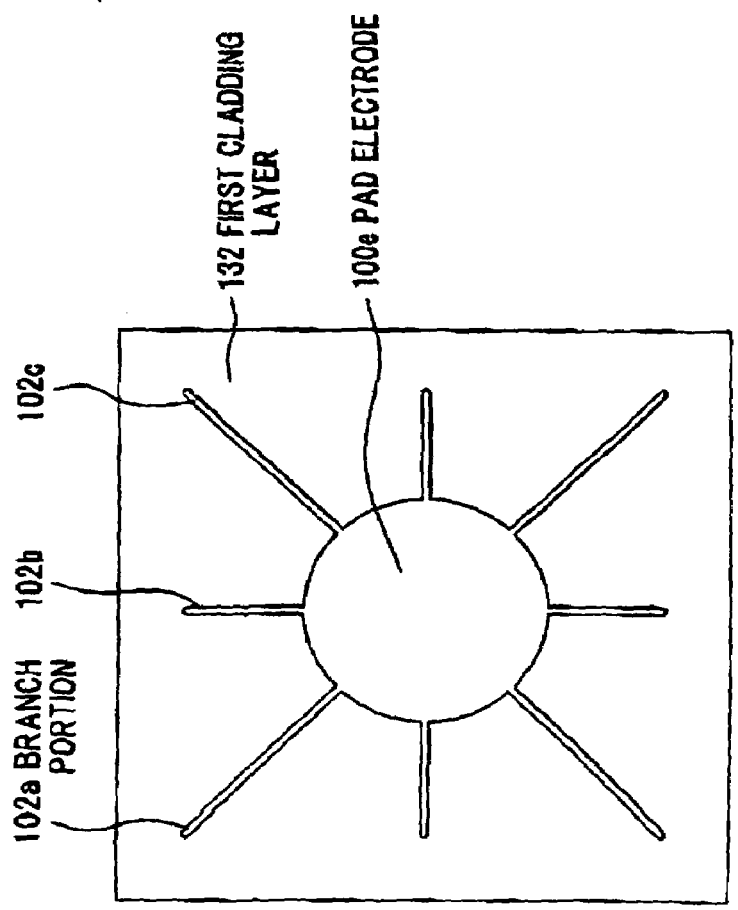

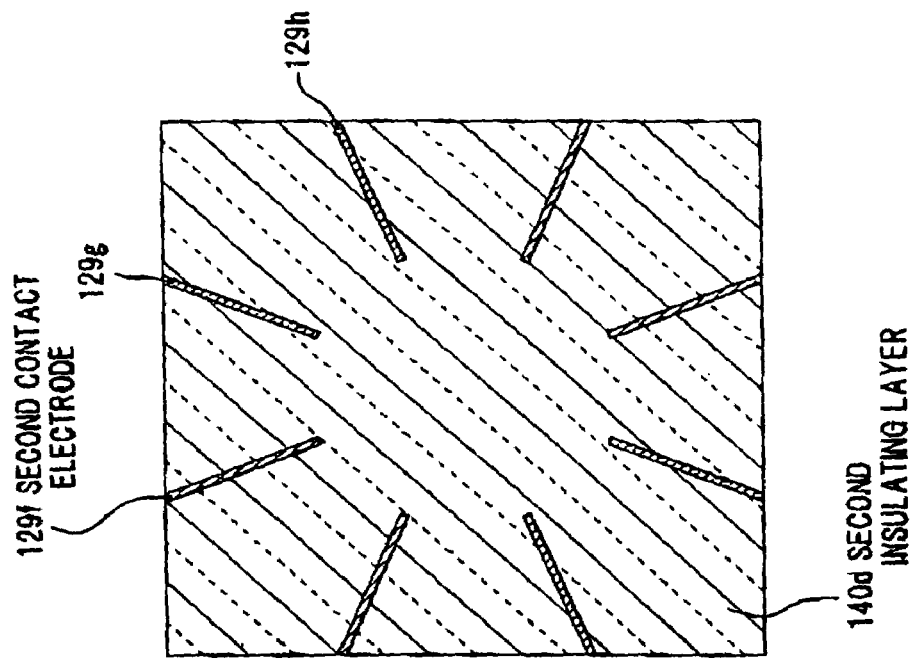
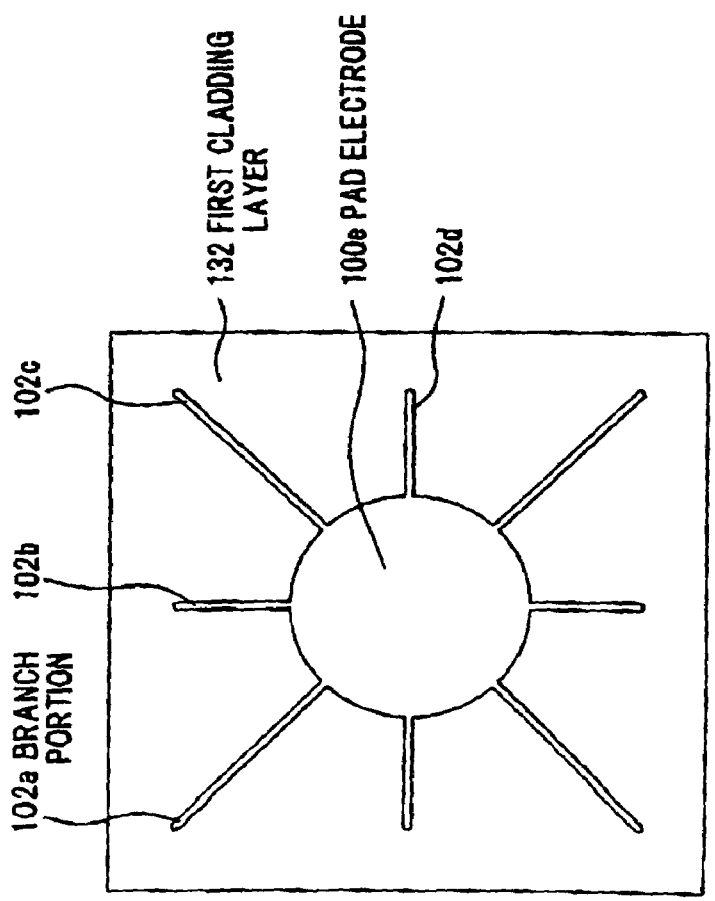

LIGHT EMITTING DEVICE

The present application is based on Japanese Patent Application No. 2007-241209 filed on Sep. 18, 2007, the entire contents of which are incorporated herein by reference.

BACKGROUND OF THE INVENTION

1. Field of the Invention

The present invention relates to a light emitting device, in more particular, to a light emitting device, in which a photoelectric conversion efficiency is improved by improving a light extract efficiency.

2. Related Art

As one of conventional light emitting diodes, for instance, there is an LED in which a light emitting part of an active layer is not located right under an electrode provided at a light extracting side.

This type of LED comprises a GaAs substrate, a semiconductor multilayer structure formed on one surface of the GaAs substrate, the semiconductor multilayer structure comprising an n-type cladding layer, a p-type cladding layer, and an active layer provided between the n-type cladding layer and the p-type cladding layer, a circular upper electrode having a predetermined outer diameter that is formed on one surface of the semiconductor multilayer structure, and a lower electrode formed on another surface of the GaAs substrate, in which a concentric ring-shaped current injection region having an inner diameter and an outer diameter that are greater than an outer diameter of the upper electrode is formed at an interface between the GaAs substrate and the semiconductor multilayer structure, and a current confining layer is formed inside and outside of the current injection region. For example, Japanese Patent Publication No. 6-82862 (JP-B-6-82862) discloses this type of LED.

In this type of LED, the current injected from the upper electrode is flown through the concentric ring-shaped current injection region to the lower electrode, without passing through a part of the active layer located right under the upper electrode by means of the current confining layer. As a result, a light emission at the part of the active layer located right under the upper electrode is suppressed, and a main light emission is generated at another part of the active layer, through which the upper electrode is connected to the concentric ring-shaped current injection region, thereby improving the light extract efficiency.

Further, as another one of the conventional light emitting diodes, for instance, there is an LED, in which a light emitting part of an active layer is not located right under an electrode provided at a light extracting side, in order to relax a local current convergence to the active layer, as well as to control a light absorption in a semiconductor substrate. In this type of LED, a current confining layer is formed in a region right under an upper electrode at an interface between the semiconductor substrate and a semiconductor multilayer structure, a plurality of interface electrodes are arranged outside of the current confining layer in a matrix shape, the interface electrodes are isolated from each other by the current confining layer, and a reflecting layer is formed between the interface electrodes and current confining layer and the semiconductor substrate. For example, U.S. Pat. No. 6,784,462 discloses this type of LED.

In this type of LED, the current injected from the upper electrode is flown into the lower electrode via a plurality of the electrodes disposed in the matrix shape, so that it is possible to relax the local current convergence to the active layer and to reflect the light emitted from the active layer to the semiconductor substrate side at the reflecting layer toward the upper electrode side. According to this structure, it is possible to suppress the absorption of the light emitted from the active layer by the semiconductor substrate.

However, in the LED disclosed by JP-B-6-82862, since a part of the light emitted from the active layer is absorbed by the upper electrode and the GaAs substrate, there is a limit for the improvement in the light extract efficiency. In addition, in the LED disclosed by U.S. Pat. No. 6,784,462, since there is a difference in distances from the upper electrode to the respective interface electrodes in addition to the absorption of the light by the upper electrode as described above, a difference is caused in electric resistance of a plurality of current paths between the upper electrode and the respective interface electrodes through the active layer. Therefore, a difference is caused in the current flowing through the active layer, so that a difference is caused in heat generation (elevation of a temperature), luminance, and the like. As a result, there is a disadvantage in that the driving voltage and the lifetime of the LED vary among the respective devices.

SUMMARY OF THE INVENTION

Therefore, it is an object of the invention to provide a light emitting device, in which the light extract efficiency is improved, the luminance and heat generation (elevation of the temperature) in the light emitting region of the active layer are uniformed, and the dispersion of the driving voltage and lifetime among the devices are suppressed.

According to a feature of the invention, a light emitting device comprises:

a semiconductor multilayer structure including a light emitting layer;

an upper electrode formed on one surface of the semiconductor multilayer structure;

an interface electrode formed at a region on another surface of the semiconductor multilayer structure except a region right under the upper electrode, the interface electrode having a center that coincides with a center of the upper electrode and at least a part having a similar shape to a shape of an outer periphery of the upper electrode;

a current blocking layer formed at another region on said another surface of the semiconductor multilayer structure except the region where the interface electrode is formed, for transmitting a light emitted from the light emitting layer;

a reflecting layer electrically connected to the interface electrode, for reflecting a light transmitted through the current blocking layer that is a part of the light emitted from the light emitting layer to a side of said one surface of the semiconductor multilayer structure; and an electrically conductive supporting substrate electrically connected to the semiconductor multilayer structure at an opposite side of the reflecting layer with respect to the semiconductor multilayer structure.

In the light emitting device, the upper electrode may have a circular shape and the interface electrode may have an annular shape. The interface electrode having the annular shape may have a ring-shape, and a center of the ring-shaped interface electrode may coincide with a center of the upper electrode. The upper electrode may comprise a pad electrode part having a circular shape or a polygonal shape; a contact electrode part electrically connected to the pad electrode part at its upper portion, and electrically bonded to said one surface of the semiconductor multilayer structure at its lower portion, for supplying a current to the light emitting layer, and the pad electrode part may contact to the semiconductor multilayer structure at a region except a region contacting to the contact electrode part.

The upper electrode may comprises a pad electrode part having a circular shape or a polygonal shape; a contact electrode part electrically connected to the pad electrode part at its upper portion, and electrically bonded to said one surface of the semiconductor multilayer structure at its lower portion, for supplying a current to the light emitting layer; and a current blocking layer covering said one surface of the semiconductor multilayer structure at a region except a region where the pad electrode part contacts to the contact electrode part, for transmitting the light emitted from the light emitting layer.

According to another feature of the invention, a semiconductor light emitting device comprises:

a semiconductor multilayer structure including a light emitting layer;

a ring-shaped upper electrode formed on one surface of the semiconductor multilayer structure;

an electrically conductive supporting substrate provided on another surface of the semiconductor multilayer structure;

a reflecting layer formed on a surface of the conductive supporting substrate at a side of the semiconductor multilayer structure; and a ring-shaped interface electrode formed concentrically with the ring-shaped upper electrode at an interface between said another surface of the semiconductor multilayer structure and the reflecting layer, and having a diameter greater than that of the ring-shaped upper electrode.

Effects of the Invention

According to the light emitting device of the present invention, it is possible to improve the light extract efficiency, to uniform the luminance and heat generation (elevation of the temperature) in the light emitting region of the active layer, and to suppress the dispersion of the driving voltage and lifetime among the devices.

BRIEF DESCRIPTION OF THE DRAWINGS

FIGS. 5A and 5B are explanatory diagrams showing steps of the manufacturing process of the light emitting device in the first preferred embodiment;

FIGS. 8A and 8B are explanatory diagrams showing steps of the manufacturing process of the light emitting device in the first preferred embodiment;

FIG. 9 is a schematic diagram showing a state of a light emission of the light emitting device in the first preferred embodiment;

FIG. 10 is a vertical cross sectional view of a light emitting device in a second preferred embodiment according to the invention;

FIG. 11 is a vertical cross sectional view of a light emitting device in a first variation;

FIG. 16A is a plan view of the light emitting device in a sixth variation, and FIG. 16B is a sectional plan view of the light emitting device in the sixth variation;

FIG. 18A is a plan view of a light emitting device in a seventh variation, and FIG. 18B is a sectional plan view of the light emitting device in the seventh variation.

PREFERRED EMBODIMENTS OF THE INVENTION

First Preferred Embodiment

Figure 1:
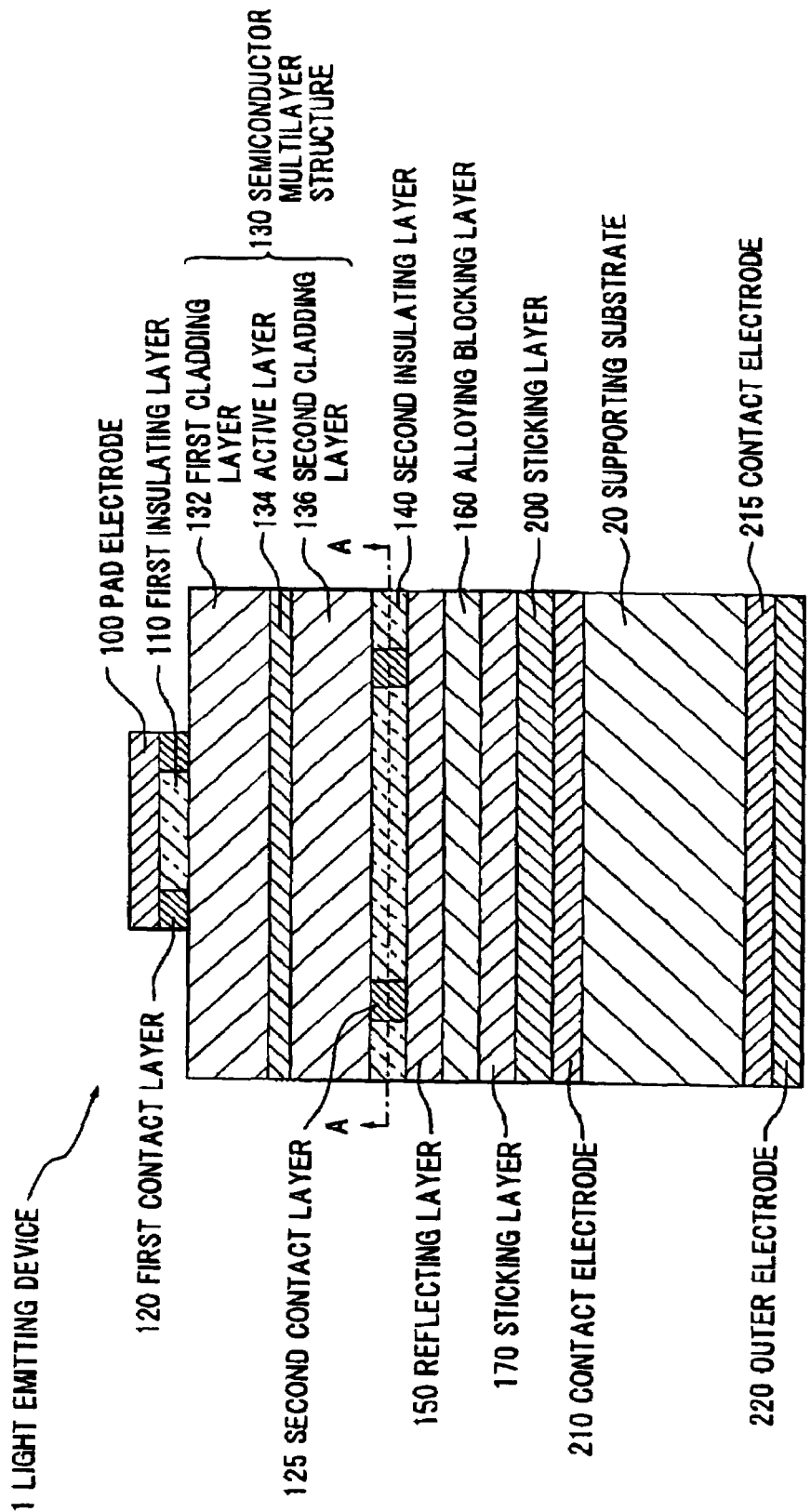
FIG. 1 is a vertical cross sectional view of a light emitting device in a first preferred embodiment according to the invention.
Figure 2B:
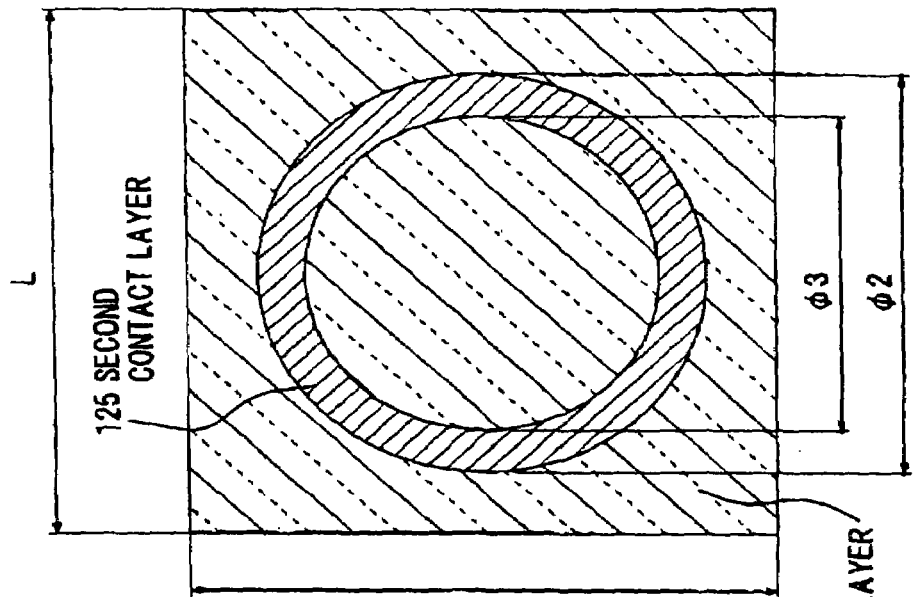
FIG. 2B is a plan view of the light emitting device cut along A-A line in FIG. 1.
Figure 2A:
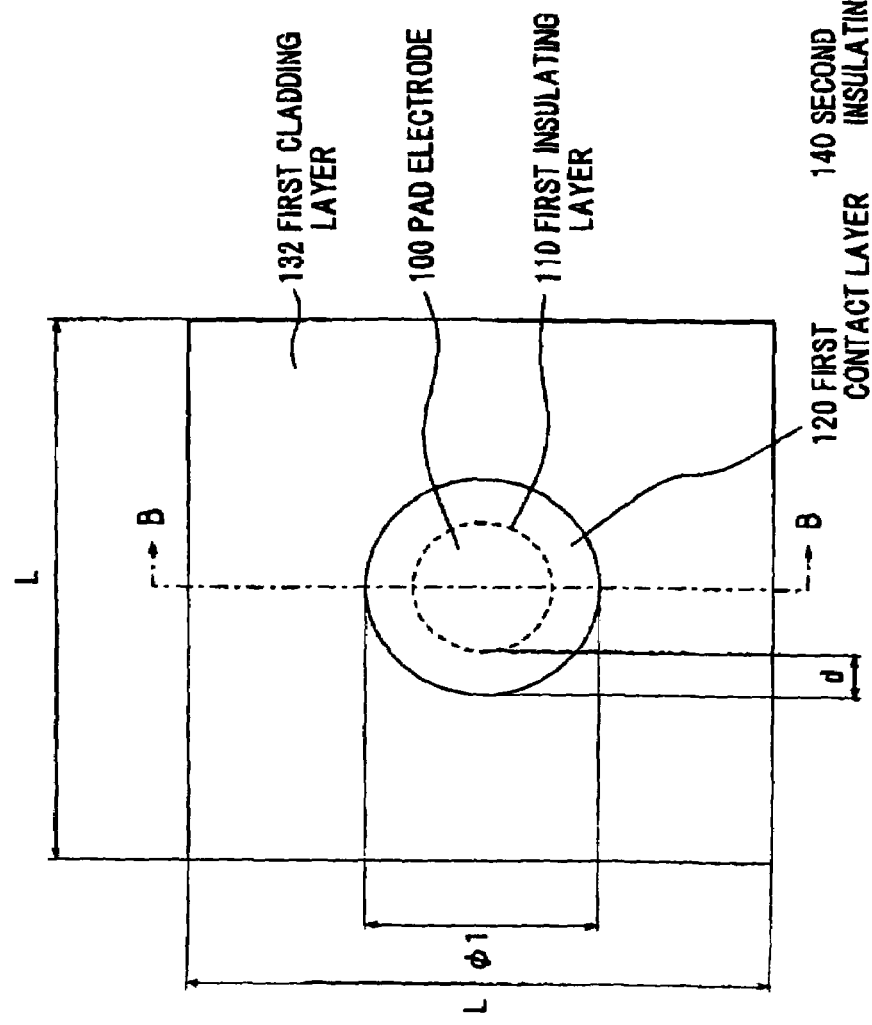
FIG. 2A is a plan view of the light emitting device in the first preferred embodiment.

FIG. 1 is a vertical cross sectional view of a light emitting device in the first preferred embodiment according to the invention. FIG. 2A is a plan view of the light emitting device in the first preferred embodiment, and FIG. 2B is a plan view of the light emitting device cut along A-A line in FIG. 1.

(Structure of a Light Emitting Device 1)

A light emitting device 1 in the first preferred embodiment comprises a semiconductor multilayer structure 130 having an active layer 134 as a light emitting layer for emitting a light with a predetermined wavelength, a ring-shaped first contact electrode 120 as a part of an upper electrode that is electrically connected to a part of one surface of the semiconductor multilayer structure 130, a first insulating layer 110 covering the part of said one surface of the semiconductor multilayer structure 130 in the ring-shaped first contact electrode 120, and a pad electrode 100 for wire bonding as another part of the upper electrode provided on the first contact electrode 120 and the first insulating layer 110.

The light emitting device 1 further comprises a ring-shaped second contact electrode 125 that is electrically connected to a part of another surface of the semiconductor multilayer structure 130 at an opposite side with respect to said one surface, a second insulating layer 140 covering a region on said another surface of the semiconductor multilayer structure 130 except a region where the second contact electrode 125 is provided, and a reflecting layer 150 provided at an opposite side of the second contact electrode 125 and the second insulating layer 140 with respect to said another surface of the semiconductor multilayer structure 130.

The light emitting device 1 further comprises an alloying blocking layer 160 provided at an opposite side of the reflecting layer 150 with respect to the surface contacting to the second contact electrode 125 and the second insulating layer 140, and a sticking layer 170 provided at an opposite side of the alloying blocking layer 160 with respect to the surface contacting to the reflecting layer 150.

The light emitting device 1 further comprises a sticking layer 200 that is electrically and mechanically bonded to the sticking layer 200, a contact electrode 210 provided at an opposite side of the sticking layer 200 with respect to a surface bonded to the sticking layer 170, and an electrically conductive supporting substrate 20 provided at an opposite side of the contact electrode 210 with respect to the surface contacting to the sticking layer 200.

In addition, the light emitting device 1 further comprises a contact electrode 215 provided on a surface at an opposite side of the supporting substrate 20 with respect to the surface on which the contact electrode 210 is provided, and an outer electrode 220 provided as an electrode for die-bonding at an opposite side of the contact electrode 215 with respect to the surface contacting to the supporting substrate 20.

As shown in FIG. 2A, the light emitting device 1 in this predetermined embodiment is formed to have a substantially square shape in plan view. As an example of plane dimension of the light emitting device 1, a vertical length L and a horizontal length L are about 250 μm, respectively. In addition, a thickness of the light emitting device 1 is about 200 μm.

The semiconductor multilayer structure 130 in this predetermined embodiment has a double-hetero (DH) structure comprising an AlGaInP based compound semiconductor.

In more concrete, the semiconductor multilayer structure 130 comprises a first cladding layer 132 comprising a first conductivity type (n-type) AlGaInP, an active layer 134 comprising an AlGaInP based compound semiconductor including a quantum well structure, and a second cladding layer 136 comprising a second conductivity type (namely different from the first conductivity type: p-type) AlGaInP, in which the active layer 134 is sandwiched by the first cladding layer 132 and the second cladding layer 136.

Herein, the active layer 134 emits the light with the predetermined wavelength when a current is supplied from outside. As an example, the active layer 134 is formed to emit a red light having a wavelength of 630 nm. The first cladding layer 134 contains a predetermined concentration of an n-type dopant such as Si. The second cladding layer 136 contains a predetermined concentration of a p-type dopant such as Zn, C.

The first contact electrode 120 as a contact electrode part that is a part of the upper electrode is formed in a ring-shape on the semiconductor multilayer structure 130. To be concrete, the first contact electrode 120 is formed such that a center of the first contact electrode 120 is located at a substantially center part of an upper part of the first cladding layer 132. As shown in FIG. 2A, the first contact electrode 120 has for example an outer diameter φ1 of 100 μm and a width d of 20 μm. The first contact electrode 120 comprises an electrically conductive material that is ohmic-contacted with the first cladding layer 132. For example, the first contact electrode 120 comprises a metal material including Au, Ge, and Ni as an n-type electrode material. As an example, the first contact electrode 120 is formed by depositing AuGe/Ni/Au in this order from a side of the first cladding layer 132.

The first insulating layer 110 as a current blocking part is formed inside the ring of the first contact electrode 120. In other words, the first insulating layer 110 is formed to cover an exposed surface of the first cladding layer 132 inside the ring of the first contact electrode 120, and a shape of the first insulating layer 110 in plan view is a substantially round shape with a diameter of about 60 μm. The first insulating layer 110 is transparent with respect to the light with the predetermined wavelength emitted from the active layer 134, and comprises an electrical insulating material. For example, the first insulating layer 110 comprises $SiO_2$.

The pad electrode 100 as a pad electrode part that is another part of the upper electrode is formed on an upper part of the semiconductor multilayer structure 130 to have a substantially circular shape. To be concrete, the pad electrode 100 is formed on the first contact electrode 120 and the first insulating layer 110 as shown in FIG. 2A. Herein, the pad electrode 100 and the first contact electrode 120 are electrically connected to each other at an outer periphery of the pad electrode 100. The pad electrode 100 may have a polygonal shape.

A center of the pad electrode 100 corresponds to a substantially center part of the first cladding layer 132, and the first contact electrode 120 and the first insulating layer 110 are formed right under the pad electrode 100. As an example, the pad electrode 100 is formed to have a diameter of 100 μm that is same as the outer diameter φ1 of the first contact electrode 120. In addition, the pad electrode 100 comprises a metal which is mainly composed of Au.

The second insulating layer 140 as a current blocking layer is formed on a substantially entire surface at the opposite side of the second cladding layer 136 with respect to a surface on which the active layer 134 is formed. Further, a groove with a predetermined shape penetrating through the second insulating layer 140 is provided at a region of the second insulating layer 140. As an example, the groove provided in the second insulating layer 140 has a shape similar to that of the first contact electrode 120. In other words, the groove provided in the second insulating layer 140 is formed to have a substantially ring-shape. The second insulating layer 140 is transparent with respect to the light with the predetermined wavelength emitted from the active layer 134, and comprises an electrical insulating material. For example, the second insulating layer 140 comprises $SiO_2$.

The groove is formed in the second insulating layer 140 such that the center of the ring of the first contact electrode 120 in plan view approximately coincides with a center of the ring of the groove provided in the second insulating layer 140 in plan view. As an example, the groove provided in the second insulating layer 140 is formed to have an outer diameter of 190 μm, an inner diameter of 150 μm, and a width of 20 μm. In other words, the ring-shaped groove provided in the second insulating layer 140 is formed such that the inner diameter of the groove is larger than the outer diameter of the first contact electrode 120.

The second contact electrode 125 as an interface electrode is formed by filling a predetermined metal material in the ring-shaped groove formed in the second insulating layer 140. The second contact electrode 125 comprises a part having a shape similar to that of the outer periphery of the circular pad electrode 100 or the outer periphery of the first contact electrode 120. In other words, the second contact electrode 125 has a circular part that is a similar shape to that of the outer periphery of the circular pad electrode 100 or the outer periphery of the first contact electrode 120. As an example, the second contact electrode 125 is formed to have a ring-shape that is an annular shape with an outer diameter φ2 of 190 μm, an inner diameter φ3 of 150 μm, and a width of 20 μm, as shown in FIG. 2B.

The second contact electrode 125 comprises an electrically conductive material that is ohmic-contacted with the second cladding layer 136, for example, a metal material including Au and Be as a p-type electrode material. As an example, the second contact electrode 125 comprises an AuBe electrode. Herein, the annular shape means a substantially annular shape, and the annular shape is not necessarily a completely closed shape. In addition, the inner periphery shape and the outer periphery shape of the annular-shaped portion are not necessarily perfect circles, and may be slightly distorted. Further, the second contact electrode 125 may comprise an AuZn electrode.

The reflecting layer 150 comprises an electrically conductive material having a reflectance not less than a predetermined value with respect to the light emitted from the active layer 134. As an example, the reflecting layer 150 comprises a metal layer which is mainly composed of Au. In addition, the reflecting layer 150 is electrically connected to the second contact electrode 125. The alloying blocking layer 160 comprises an electrically conductive material that is electrically connected to the reflecting layer 150. As an example, the alloying blocking layer 160 comprises a metal layer which is mainly composed of Ti.

The sticking layer 170 comprises an electrically conductive material having a predetermined film thickness. The sticking layer 170 is electrically connected to the alloying blocking layer 160. As an example, the sticking layer 170 comprises a metal layer which is mainly composed of Au.

In addition, the sticking layer 200 comprises a material same as that of the sticking layer 170 and bonded to the sticking layer 170. To be concrete, the sticking layer 170 and the sticking layer 200 are electrically and mechanically connected to each other. The contact electrode 210 comprises an electrically conductive material which is electrically conductive with the supporting substrate 20. As an example, the contact electrode 210 is mainly composed of Ti, and electrically connected to the sticking layer 200.

The supporting substrate 20 has a predetermined thermal conductivity and comprises an electrically conductive material. As an example, the supporting substrate 20 comprises Si having a thickness of 200 μm. In addition, as far as the supporting substrate 20 has the electrical conductivity, a conductivity type thereof may be either n-type or p-type. The contact electrode 215 is formed to be electrically connected to the supporting substrate 20 on a surface at the opposite side of the supporting substrate 20 with respect to the surface contacting to the contact electrode 210. As an example, the contact electrode 215 is mainly composed of Al.

The outer electrode 220 as the electrode for die-bonding is formed to be electrically connected to the contact electrode 215 on a surface at the opposite side of the contact electrode 215 with respect to the surface contacting to the supporting substrate 20. The outer electrode 220 is formed on the entire surface of the contact electrode 215. As an example, the outer electrode 220 is mainly composed of Au.

The light emitting device 1 in this predetermined embodiment having the aforementioned structure is an LED which emits the light with the wavelength in a red region. For example, the light emitting device 1 is a red LED which emits a light with a peak wavelength of 630 nm, when a forward voltage is 1.95 V and a forward current is 20 mA.

Figure 3:
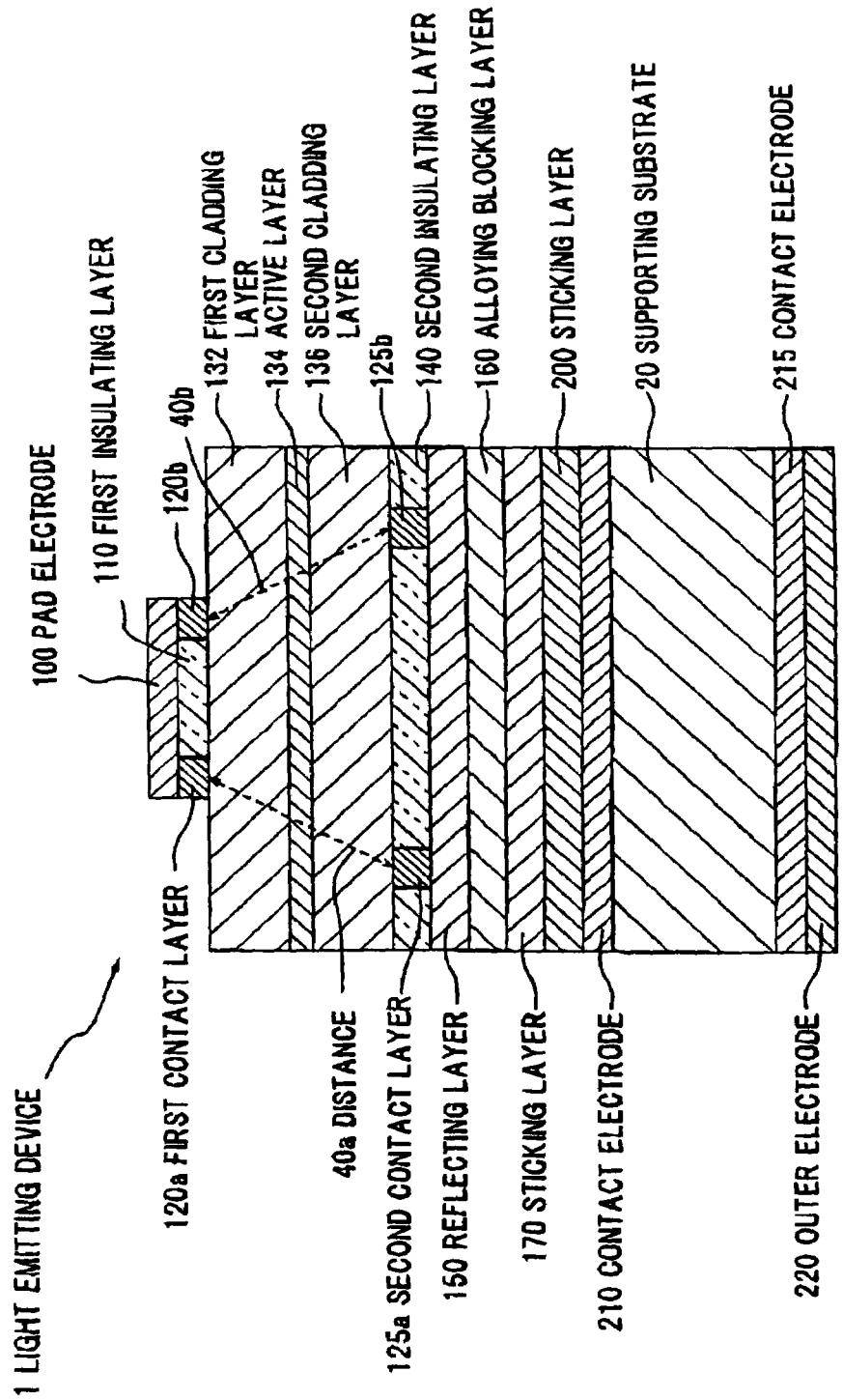
FIG. 3 is a partial cross sectional view of the light emitting device 1 along B-B line in FIG. 2B.

FIG. 3 is a partial cross sectional view of the light emitting device 1 along B-B line in FIG. 2B.

In the light emitting device 1 in this predetermined embodiment, the first contact electrode 120 and the second contact electrode 125 are formed to have the ring-shape respectively. The center of the first contact electrode 120 in plan view and the center of the second contact electrode 125 in plan view are formed to substantially coincide with each other. In other words, the first contact electrode 120 and the second contact electrode 125 are concentrically disposed in plan view. According to this structure, the inner diameter and the outer diameter of the second contact electrode 125 are formed to be greater than the inner diameter and the outer diameter of the first contact electrode 120, respectively.

Therefore, in the vertical cross section of the light emitting device 1, a shortest distance from the first contact electrode 120 to the second contact electrode 125 is substantially constant. For example, a distance 40a between a first contact electrode 120a and a second contact electrode 125a distant by the shortest distance from the first contact electrode 120a is substantially equal to a distance 40b between a first contact electrode 120b and a second contact electrode 125b distant by the shortest distance from the first contact electrode 120b.

(Variation of the Light Emitting Device 1)

In addition, the light emitting device 1 in this predetermined embodiment emits the light with the peak wavelength of 630 nm in the red region. However, the peak wavelength of the light emitted from the light emitting device 1 is not limited to this wavelength. Further, it is possible to provide the light emitting device 1 with a predetermined wavelength range, by controlling the structure of the active layer 134 in the semiconductor multilayer structure 130. Still further, the semiconductor multilayer structure 130 in the light emitting device 1 may comprise an InAlGaN based compound semiconductor including an active layer 134 which emits a light in an ultraviolet region, a purple region or a blue region, or comprise an InAlGaAs based compound semiconductor including an active layer 134 which emits a light in an infrared region.

In addition, the plane dimension of the light emitting device 1 is not limited to this preferred embodiment. As another example of the plane dimension of the light emitting device 1, the vertical length L and the horizontal length L may be about 350 μm, respectively. Further, in accordance with applications of the light emitting device 1, the vertical length and the horizontal length may be changed appropriately for manufacturing the light emitting device 1.

In addition, the quantum well structure of the active layer 134 may comprise either a single quantum well structure or a multiquantum well structure. In addition, the active layer 134 may comprise a compound semiconductor having a bandgap smaller than both of a bandgap of the first cladding layer 132 and a bandgap of the second cladding layer 136 to form the semiconductor multilayer structure 130 having the double hetero (DH) structure.

The semiconductor multilayer structure 130 may further comprise a first contact layer having an impurity concentration higher than an impurity concentration of the first cladding layer 132 at a side of a surface of the first cladding layer 132 on which the first contact electrode 120 is formed. As an example, the first contact layer may comprise a GaAs layer which contains the n-type dopant with the impurity concentration higher than the impurity concentration of the first cladding layer 132. It is possible to lower a contact resistance between the first contact electrode 120 and the first contact layer than a contact resistance between the first contact electrode 120 and the first cladding layer 132, by providing the first contact layer.

Similarly, the semiconductor multilayer structure 130 may further comprise a second contact layer having an impurity concentration higher than an impurity concentration of the second cladding layer 136 at a side of a surface of the second cladding layer 136 on which the second contact electrode 125 is formed. As an example, the second contact layer may comprise a GaAs layer which contains the p-type dopant with the impurity concentration higher than the impurity concentration of the second cladding layer 136. It is possible to lower a contact resistance between the second contact electrode 125 and the second contact layer than a contact resistance between the second contact electrode 125 and the second cladding layer 136, by providing the second contact layer.

In addition, the first cladding layer 132 and the second cladding layer 136 may be formed such that a resistance value of the first cladding layer 132 is lower than a resistance value of the second cladding layer 136, for the purpose of suppressing the light emission in the active layer 134 which is located right under the pad electrode 100.

In addition, a convexo-concave portion may be provided as a convexo-concave part with a predetermined dimension on a surface at the opposite side of the first cladding layer 132 with respect to the surface contacting to the active layer 134 and/or at an interface between the second cladding layer 136 and the second insulating layer 140, for the purpose of effectively extract the light from the active layer 134 to the outside. Further, a transparent conductive film comprising a transparent conductive material such as an ITO (Indium Tin Oxide) may be formed as a current spreading part at a region in the first cladding layer 132 except a region where the first contact electrode 120 and the first insulating layer 110 are provided, so that the current is supplied to be spread along a laminating direction of the a compound semiconductor multilayer structure in the active layer 134.

Still further, the first contact electrode 120 may be formed to have a branch shape to function as the current spreading part, so that the current is supplied to be spread along a laminating direction of the a compound semiconductor multilayer structure in the active layer 134. In this case, the second contact electrode 125 with a similar shape to that of the first contact electrode 120 and a larger dimension than that of the first contact electrode 120 is formed on a surface at the opposite side of the second cladding layer 136 with respect to the active layer 134. In addition, as far as the distance from the outer periphery part of first contact electrode 120 to the inner periphery part of the second contact electrode 125 is at least substantially constant, the shape of the second contact electrode 125 may not be strictly similar to the shape of the first contact electrode 120.

In addition, the supporting substrate 20 may comprise a metal plate composed of a metal material such as Cu, Al that is an electrically conductive material, or an alloy plate composed of an alloy material such as CuW. In addition, the supporting substrate 20 may comprise a substrate having a multilayer structure in which a plurality of the electrically conductive materials are laminated, or a substrate having a thick film structure with a thickness greater than 200 µm, for example, in order to improve a corrosion resistance or to reduce the contact resistance between the contact electrode 210 and the supporting substrate 20 and the contact resistance between the contact electrode 215 and the supporting substrate 20.

Furthermore, the electrically conductive materials composing the first contact electrode 120, the second contact electrode 125, the contact electrode 210, and the contact electrode 215 respectively are not limited to the materials explained in this preferred embodiment. The electrically conductive material may be changed appropriately in accordance with a contact resistance value with a material contacting to each of the electrodes and the like. In addition, the electrically conductive material composing the reflecting layer 150 may be selected appropriately from materials having a reflectance greater than the predetermined value with respect to the wavelength of the light emitted from the active layer 134.

(Method of Manufacturing the Light Emitting Device 1)

FIGS. 4A to 8B are explanatory diagrams showing steps of the manufacturing process of the light emitting device in the first preferred embodiment.

Figure 4A:
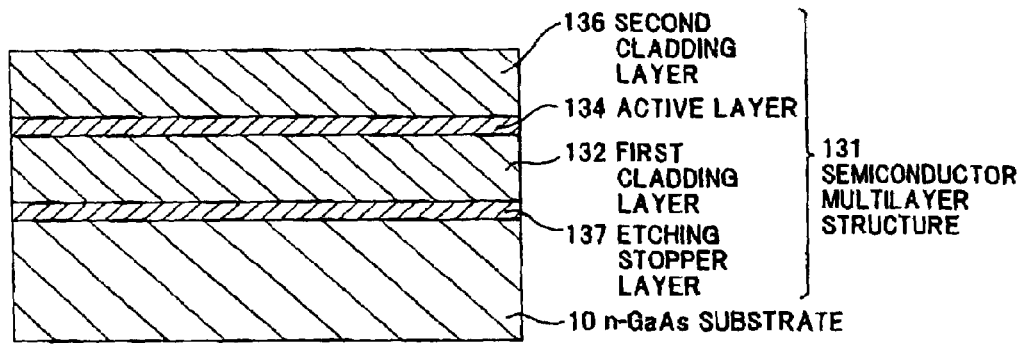
FIGS. 4A to 4C are explanatory diagrams showing steps of a manufacturing process of the light emitting device in the first preferred embodiment.

At first, as shown in FIG. 4A, an AlGaInP epitaxial layer including a plurality of layers is grown on an n-GaAs substrate 10, for example, by Metal Organic Chemical Vapor Deposition (MOCVD) method.

To be concrete, an etching stopper layer 137 mainly composed of InGaP, a first cladding layer 132 including an n-type AlGaInP, an active layer 134 including a quantum well structure, and a second cladding layer 136 including a p-type AlGaInP are sequentially formed on the n-GaAs substrate 10 in this order. As a result, a semiconductor multilayer structure 131 including a plurality of epitaxial growth layers is formed on the n-GaAs substrate 10.

In addition, the semiconductor multilayer structure 131 on the n-GaAs substrate 10 may be grown by Molecular Beam Epitaxy (MBE), Halide Vapor Phase Epitaxy (HVPE), or the like.

Figure 4B:
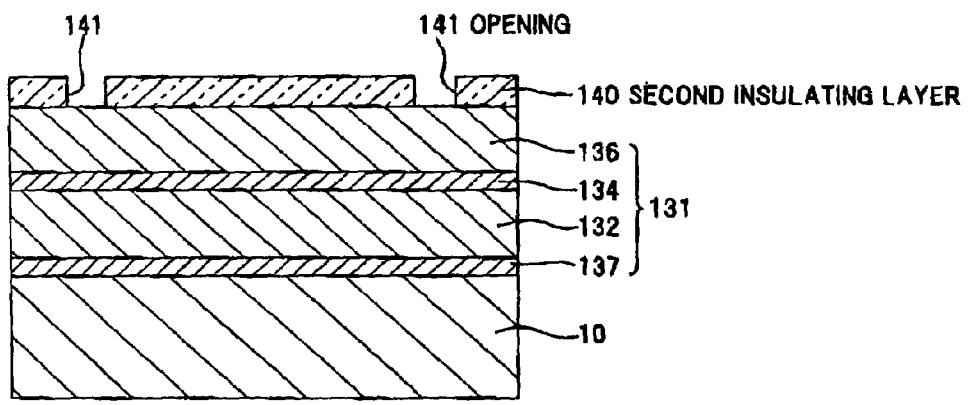

Next, a $SiO_2$ layer is formed as a second insulating layer 140 on an entire surface at an opposite side of the second cladding layer 136 with respect to a surface contacting to the active layer 134 by Chemical Vapor Deposition (CVD) method, vacuum deposition method, sputtering method or the like. Thereafter, as shown in FIG. 4B, a ring-shaped opening 141 in plan view is formed at the second insulating layer 140 by using photolithography method and etching method. As a result, a surface of the second cladding layer 136 is exposed from the opening 141.

Figure 4C:
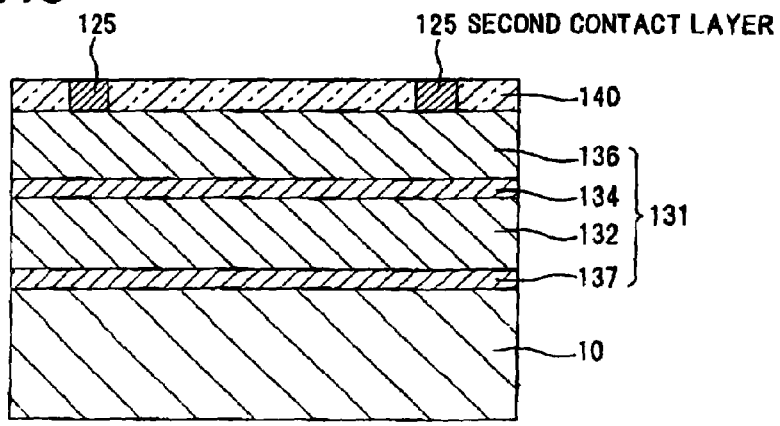

A resist is formed on a region of the second insulating layer 140 except the opening 141 by using the photolithography method. Thereafter, a metal material including AuBe is deposited in the opening 141 of the second insulating layer 140 and on the resist by using the vacuum deposition method. Successively, only the metal material deposited in the opening 141 is remained by using lift-off method. As a result, as shown in FIG. 4C, the opening 141 formed at the second insulating layer 140 is filled with the metal material including the AuBe to provide a second contact electrode 125.

Next, as shown in FIG. 5A, a reflecting layer 150 mainly composed of Au, an alloying blocking layer 160 mainly composed of Ti, and a sticking layer 170 mainly composed of Au are sequentially formed in this order on the second contact electrode 125 and the second insulating layer 140 by using the vacuum deposition method or the sputtering method. As a result, a first multilayer structure 5 mainly composed of a compound semiconductor multilayer structure is provided.

In addition, an adhesion layer for improving an adhesion between the second insulating layer 140 and the reflecting layer 150 may be formed between the second insulating layer 140 and the reflecting layer 150, for the purpose of improving the adhesion of the reflecting layer 150 with the second insulating layer 140. It is preferable that the adhesion layer comprises a material which has the electrical conductivity and easily transmits the light emitted from the active layer 134. Alternatively, it is preferable that the adhesion layer has a minimum thickness for improving the adhesion between the second insulating layer 140 and the reflecting layer 150.

Next, a contact electrode 210 mainly composed of Ti having the electrical conductivity, and a sticking layer 200 mainly composed of Au are formed on a supporting substrate 20 comprising a Si substrate by the vacuum deposition method or the sputtering method. As a result, a second multilayer structure 6 mainly composed of the supporting substrate 20 is provided. Successively, as shown in FIG. 5B, the first multilayer structure 5 is stuck on the second multilayer structure 6 such that a sticking surface 1a of the first multilayer structure 5 and a sticking surface 20a of the second multilayer structure 6 are facing to each other, and the first multilayer structure 5 and the second multilayer structure 6 are held in this state by a predetermined jig.

Successively, the jig holding the state that the first multilayer structure 5 is stuck on the second multilayer structure 6 is introduced in a wafer sticking apparatus generally used for micro-machine. Then, the wafer sticking apparatus is kept at a vacuum state under a predetermined pressure. A predetermined uniform pressure is applied to the first multilayer structure 5 stuck on the second multilayer structure 6 via the jig. Next, the jig is heated to a predetermined temperature with a predetermined temperature increasing rate.

After the temperature of the jig reached around 350° C., the jig is kept at this temperature for about 1 hour. Thereafter, the jig is slowly cooled. The temperature of the jig is decreased enough, for example, to a room temperature. After the temperature of the jig is fallen, the pressure applied to the jig is left open. Then, the pressure in the wafer sticking apparatus is reduced to an atmospheric pressure, and the jig is taken out.

Figure 6A:
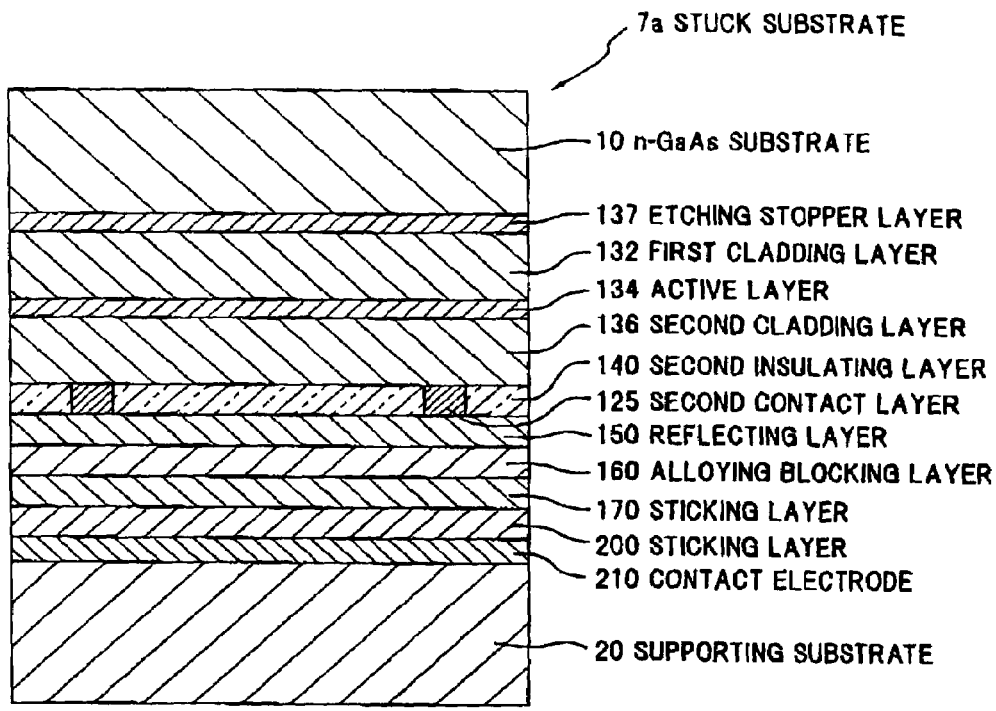
FIGS. 6A and 6B are explanatory diagrams showing steps of the manufacturing process of the light emitting device in the first preferred embodiment.

After this process, a stuck substrate 7a in which the first multilayer structure 5 and the second multilayer structure 6 are mechanically and electrically bonded to each other at an interface between the sticking layer 170 and the sticking layer 200 is formed as shown in FIG. 6A.

In this predetermined embodiment, the first multilayer structure 5 comprises the alloying blocking layer 160. Therefore, even if the first multilayer structure 5 and the second multilayer structure 6 are bonded to each other at the interface between the sticking surface 1a and the sticking surface 20a, it is possible to prevent the reflecting layer 150 from deformation due to the pressure of the sticking process or the like. In addition, the alloying blocking layer 160 prevents the materials of the sticking layer 170 and the sticking layer 200 from diffusing into the reflecting layer 150 due to the heat during the sticking process, thereby preventing deterioration of a reflecting property of the reflecting layer 150.

Next, the supporting substrate 20 is stuck on a predetermined lapping board by a predetermined sticking wax. Then, the n-GaAs substrate 10 is lapped until the thickness of the n-GaAs substrate 10 is reduced to be about 30 μm. Thereafter, the stuck substrate 7a after lapping is detached from the lapping board, and the wax remained on the surface of the supporting substrate 20 is removed by cleaning.

Figure 6B:
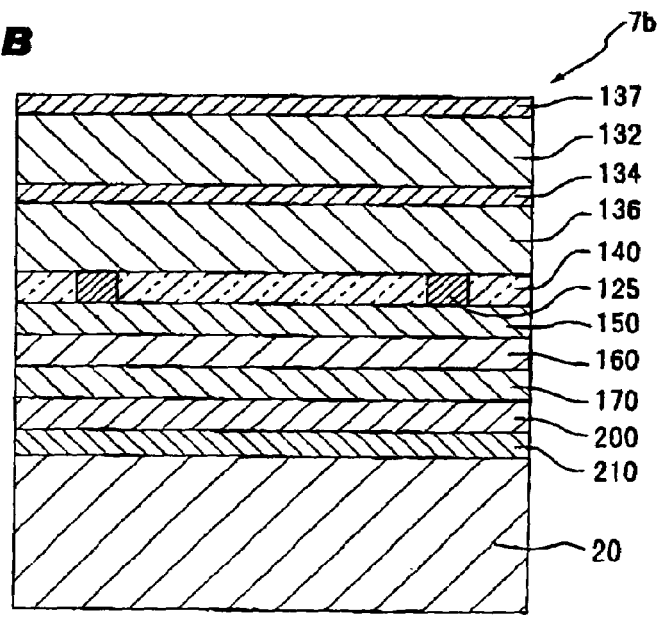

Next, as shown in FIG. 6B, the stuck substrate 7a after lapping is etched by an etchant for GaAs etching. Then, the n-GaAs substrate 10 is completely and selectively removed from the stuck substrate 7a, to provide a stuck substrate 7b. As for the etchant for GaAs etching, an etchant comprising a solution mixing an ammonia water with a hydrogen peroxide water at a predetermined proportion may be used for example.

Figure 7A:
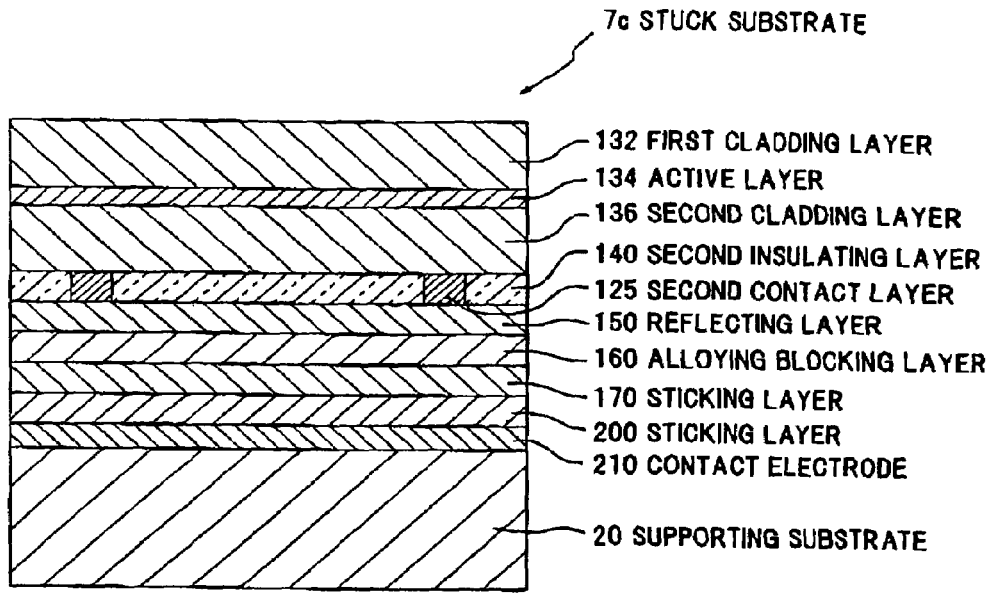
FIGS. 7A and 7B are explanatory diagrams showing steps of the manufacturing process of the light emitting device in the first preferred embodiment.

As shown in FIG. 7A, the etching stopper layer 137 mainly composed of InGaP is removed from the stuck substrate 7b by the etching using a predetermined etchant. As a result, a stuck substrate 7c in which the etching stopper layer 137 is removed is provided. As for the predetermined etchant, an etchant including hydrochloric acid may be used, and for example, an etchant comprising a solution mixing a hydrochloric acid with a phosphoric acid at a predetermined proportion may be used.

Figure 7B:
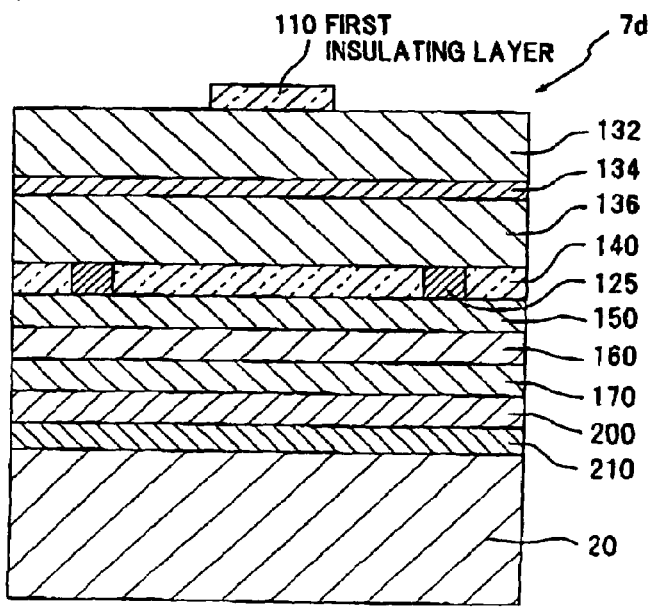

Next, a $SiO_2$ layer is formed on a substantially entire surface of an upper surface of the first cladding layer 132 by using the CVD method. Then, as shown in FIG. 7B, a first insulating layer 110 having a substantially circular shape with a diameter of about 60 μm is formed on a substantially center of the upper surface of the first cladding layer 132 by using the photolithography method. As a result, a stuck substrate 7d is provided.

Successively, a first contact electrode 120 having a ring-shape with a diameter of about 20 μm is formed at a periphery of the first insulating layer 110 by the vacuum deposition method and the photolithography method, as shown in FIG. 8A. The first contact electrode 120 is mainly composed of AuGe/Ni/Au.

Next, a pad electrode 100 is formed on an upper part of the first insulating layer 110 and an upper part of the first contact electrode 120 by using the vacuum deposition method and the photolithography method. In addition, it is preferable to interpose an adhesive material between the first insulating layer 110 and the pad electrode 100 in order to prevent the pad electrode 100 from exfoliating from the first insulating layer 110. It is preferable that the adhesive material comprises a material which easily transmits the light emitted from the active layer 134 or a material having a predetermined reflectance with respect to the light emitted from the active layer 134. For example, the adhesive material may be mainly composed of Ti Successively, a minute convexo-concave portion is formed on a region where the first insulating layer 110 and the first contact electrode 120 are not formed at a surface of the first cladding layer 132 by using the etching and the photolithography method. By forming such minute convexo-concave portion, the light emitted from the active layer 134 is totally reflected at an interface between the first cladding layer 132 and air, so that it is possible to suppress a return of the light emitted from the active layer 134 toward the active layer 134.

Further, a contact electrode 215 mainly composed of Al and an outer electrode 220 for die-bonding are formed on an entire surface of a lower surface of the supporting substrate 20 by the vacuum deposition method. Successively, an alloying process is conducted on a stuck substrate 7e in which the first insulating layer 110, the first contact electrode 120, the pad electrode 100, the contact electrode 215, and the outer electrode 220 are formed, at a predetermined temperature in a predetermined atmosphere.

The stuck substrate 7e on which the alloying process is conducted is divided into a plurality of device structures by etching or mesa isolation process using a half dice. The stuck substrate 7e after the alloying process or mesa isolation process is subjected to a dicing process, to provide a plurality of the light emitting devices 1. As a result, the light emitting device 1 as shown in FIG. 8B is provided.

The light emitting device 1 thus manufactured is mounted on a predetermined stem by using a silver (Ag) paste. The light emitting device 1 is resin-sealed by molding the stem on which the emitting device 1 is mounted with a predetermined resin. As for evaluation of the resin-sealed light emitting device 1, the peak wavelength was 630 nm and the light output was within a range from 25 mW to 27 mW, when the forward voltage is 1.95 V and the forward current is 20 mA. In other words, the photoelectric conversion efficiency of the light emitting device 1 was not less than about 64%.

In addition, when the light emitting device 1 is mounted on the stem, it is preferable to use a eutectic alloy of AuSn from the viewpoint of heat radiation characteristics.

Further, in a case of manufacturing the light emitting device 1 from a chemical compound semiconductor multilayer structure comprising an InAlGaN based compound semiconductor material grown on a sapphire substrate, it is possible to manufacture a light emitting device in which the current is flown in a vertical direction (top and bottom direction) by using a manufacturing process similar to the manufacturing process described above.

FIG. 9 is a schematic diagram showing a state of a light emission of the light emitting device in the first preferred embodiment.

The active layer 134 of the light emitting device 1 emits the light with the predetermined wavelength, when the current is supplied. For example, FIG. 9 shows a case that the light is emitted from a predetermined point (light emitting point 134*a*) in the active layer 134. As indicated by an optical path 30*a* and an optical path 30*c*, a part of the light emitted from the light emitting point 134*a* in the active layer 134 is propagated through the second cladding layer 136 and the second insulating layer 140, and reflected at an interface 150*a* between the reflecting layer 150 and the second insulating layer 140, to be radiated to outside of the light emitting device 1.

Further, as indicated by an optical path 30*b*, another part of the light emitted from the light emitting point 134*a* in the active layer 134 is propagated through the first cladding layer 132, to be radiated to the outside of the light emitting device 1. Further, as indicated by an optical path 30*d*, still another part of the light emitted from the light emitting point 134*a* in the active layer 134 is propagated through the first cladding layer 132 and the first insulating layer 110, and reflected at an interface 110*a* between the pad electrode 100 and the first insulating layer 110 toward the reflecting layer 150. The light reflected at the pad electrode 100 is reflected at the interface 150*a* toward the outside of the light emitting device 1 to be radiated to the outside of the light emitting device 1.

A current-optical output characteristic was measured by supplying the current up to 100 mA to the light emitting device 1 in this predetermined embodiment. As a result, in the light emitting device 1, a linearity of the optical output to the current was good at least when the current is not greater than 100 mA. This effect may be explained by two reasons as follows.

The first reason is that the supporting substrate 20 of the light emitting device 1 comprises Si having a thermal conductivity of about 1.5 W/cm·K compared with GaAs having a thermal conductivity of 0.5 W/cm·K, so that the heat generated in the light emitting devices 1 is easily dissipated to the outside.

The second reason is that the distance between the first contact electrode 120 and the second contact electrode 125 is provided to be constant in the light emitting device 1 in this predetermined embodiment, so that the photoelectric conversion efficiency is improved compared with the case that the second contact electrode 125 comprises a plurality of separated and distant contact electrodes. Accordingly, the heat generated in the light emitting device 1 is reduced compared with conventional light emitting diode.

Effect of the First Preferred Embodiment

In the light emitting device 1 in the first preferred embodiment according to the present invention, the distance between the first contact electrode 120 and the second contact electrode 125 is provided to be substantially constant, so that it is possible to keep a current density of the current flown through the second contact electrode 125 substantially uniform at every locations in the second contact electrode 125. Accordingly, it is possible to reduce the driving voltage of the light emitting device as well as to suppress the local light emission of the active layer 134, thereby obtaining a stable light emission.

Further, in the light emitting device 1 in the first preferred embodiment according to the present invention, since it is possible to keep the current density of the current flown through the second contact electrode 125 substantially uniform at every locations in the second contact electrode 125, it is possible to reduce dispersion in the forward voltages in the respective light emitting devices 1 divided from a single substrate and dispersion in the luminance in the respective light emitting devices 1 divided from the single substrate.

Still further, in the light emitting device 1 in the first preferred embodiment according to the present invention, the distance between the first contact electrode 120 and the second contact electrode 125 is provided to be substantially constant, so that it is possible to keep the current density of the current flown through the second contact electrode 125 substantially uniform at every locations in the second contact electrode 125. According to this structure, even when a large current is supplied to the light emitting device 1, the current is not locally converged into a part of the second contact electrode 125, so that it is possible to suppress the local current convergence to the active layer 134, thereby reducing the heat generation of the light emitting device 1.

Further, in the light emitting device 1 in this predetermined embodiment, in both the first contact electrode 120 and the second contact electrode 125 have the ring-shape, and it is not necessary to form a plurality of the second contact electrodes each having a minute configuration. Therefore, it is possible to simplify the manufacturing process of the light emitting device 1 compared with the manufacturing process of the conventional light emitting devices, thereby improving a production yield of the light emitting device 1.

In the light emitting device 1 in this predetermined embodiment, the second contact electrode 125 is not formed right under the pad electrode 100 except the outer periphery part of the pad electrode 100, so that it is possible to suppress the light emission of the active layer 134 right under the pad electrode 100. According to this structure, it is possible to improve the light extract efficiency of the light emitting device 1.

The light emitting device 1 in this predetermined embodiment comprises the reflecting layer 150 as well as the pad electrode 100 which transmits the light emitted from the active layer 134 at an inner part of the ring-shaped first contact electrode 120 via the first insulating layer 110. Therefore, the light emitted from the active layer 134 is reflected at the interface 110*a* between the pad electrode 100 and the first insulating layer 110 to the side of the reflecting layer 150, and further reflected at the reflecting layer 150 toward the outside of the light emitting device 1. According to this structure, it is possible to significantly improve the light extract efficiency of the light emitting device 1.

Further, in the light emitting device 1 in this predetermined embodiment, since the photoelectric conversion efficiency is high, the electric power required for the light emission is small. Therefore, when using a light emitting component in an equipment, for which suppression of battery depletion is desired, such as mobile communication terminal (e.g. portable telephone), it is effective to use the light emitting device 1 in this predetermined embodiment.

Still further, in the light emitting device 1 in this predetermined embodiment, since the electric power required for the light emission is small since the photoelectric conversion efficiency is high, so that it is possible to reduce the heat generation caused by injection of the current. Accordingly, in the light emitting device 1, it is possible to reduce malfunction such as deterioration in light intensity due to the heat generation even when the large current is supplied to the light emitting device 1, so that it is possible to prolong the lifetime of the light emitting device 1. Further, since the heat generated in the light emitting device 1 is reduced, it is possible to reduce a coefficient of variation in the optical output characteristics, etc. which varies due to the heat generation. Therefore, it is effective to use the light emitting device 1 for a lamp application, in which the large current is supplied for emitting the light.

Second Preferred Embodiment

FIG. 10 is a vertical cross sectional view of a light emitting device in a second preferred embodiment according to the invention.

A light emitting device 2 in the second preferred embodiment has a substantially similar configuration to the light emitting device 1 in the first preferred embodiment, except that a shape of a pad electrode 101 is different and the first insulating layer 110 is not provided. Therefore, detailed explanation thereof is omitted except the different points.

The light emitting device 2 comprises the ring-shaped first contact electrode 120 on the first cladding layer 132. The pad electrode 101 is formed inside a ring portion of the first contact electrode 120 as well as on the first contact electrode 120. As an example, the pad electrode 101 is mainly composed of Au. The pad electrode 101 is electrically connected to the first contact electrode 120.

The pad electrode 101 contacts the first cladding layer 132 at the interface 101a however it is not necessary that the pad electrode 101 and the first cladding layer 132 are electrically connected to each other. In other words, it is not necessary that the pad electrode 101 and the first cladding layer 132 are ohmic-contacted with other. It is preferable that the pad electrode 101 comprises an electrically conductive material having a predetermined reflectance with respect to the light emitted from the active layer 134.

[First Variation]

FIG. 11 is a vertical cross sectional view of a light emitting device in a first variation.

A light emitting device 3 in the first variation has a substantially similar configuration to the light emitting device 1 in the first preferred embodiment, except that the light emitting device 3 further comprises a reflection preventing film 180. Therefore, detailed explanation thereof is omitted except the different point.

The reflection preventing film 180 comprises a transparent material with respect to the light emitted from the active layer 134. In the light emitting device 1 comprising no reflection preventing film 180, a part of the light emitted from the active layer 134 is reflected at an interface between the first cladding layer 132 and the air outside the light emitting device 1 toward the side of the active layer 134. However, by providing the reflection preventing film 180 on the surface of the first cladding layer 132, it is possible to prevent the light emitted from the active layer 134 from the reflection at the surface of the first cladding layer 132 toward the side of the active layer 134.

[Second Variation]

Figure 12:
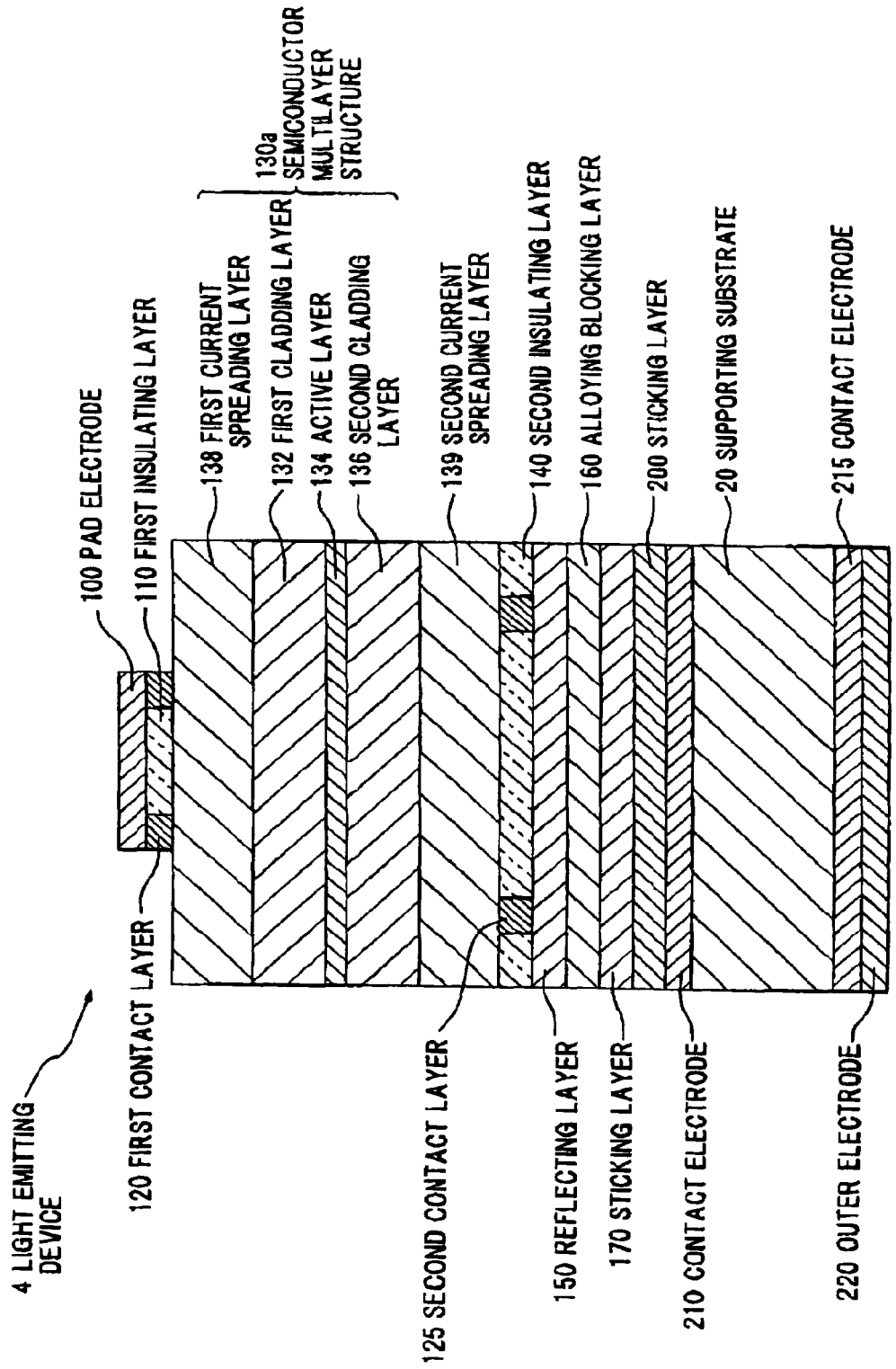
FIG. 12 is a vertical cross sectional view of a light emitting device in a second variation.

FIG. 12 is a vertical cross sectional view of a light emitting device in a second variation.

A light emitting device 4 in the second variation has a substantially similar configuration to the light emitting device 1 in the first preferred embodiment, except that the light emitting device 4 further comprises a first current spreading layer 138 and a second current spreading layer 139. Therefore, detailed explanation thereof is omitted except the different point.

A semiconductor multilayer structure 130a of the light emitting device 4 has a structure in that the semiconductor multilayer structure 130 according to the first preferred embodiment is sandwiched by the first current spreading layer 138 and the second current spreading layer 139. In other words, the semiconductor multilayer structure 130a comprises the first conductivity type first current spreading layer 138 having a resistivity smaller than a resistivity of the first cladding layer 132 at the side that the first contact electrode 120 is provided. As an example, the first current spreading layer 138 comprises an n-type AlGaAs.

The semiconductor multilayer structure 130a further comprises the second conductivity type second current spreading layer 139 having a resistivity smaller than a resistivity of the second cladding layer 136 at the side of the second cladding layer 136 where the second contact electrode 125 is provided. As an example, the second current spreading layer 139 comprises a p-type AlGaAs. In addition, the resistivity of each of the semiconductor layers is adjusted by controlling a concentration of the dopant doped to the semiconductor layer.

According to this structure, since the current supplied from the second contact electrode 125 to the semiconductor multilayer structure 130 is spread into the active layer 134, compared with the case that the first current spreading layer 138 and the second current spreading layer 1-39 are not provided, so that it is possible to improve the light emission efficiency and to lower the driving voltage of the light emitting device 4.

In addition, the semiconductor multilayer structure 130a may comprise either one of the current spreading layer 138 and the second current spreading layer 139.

[Third Variation]

Figure 13B:
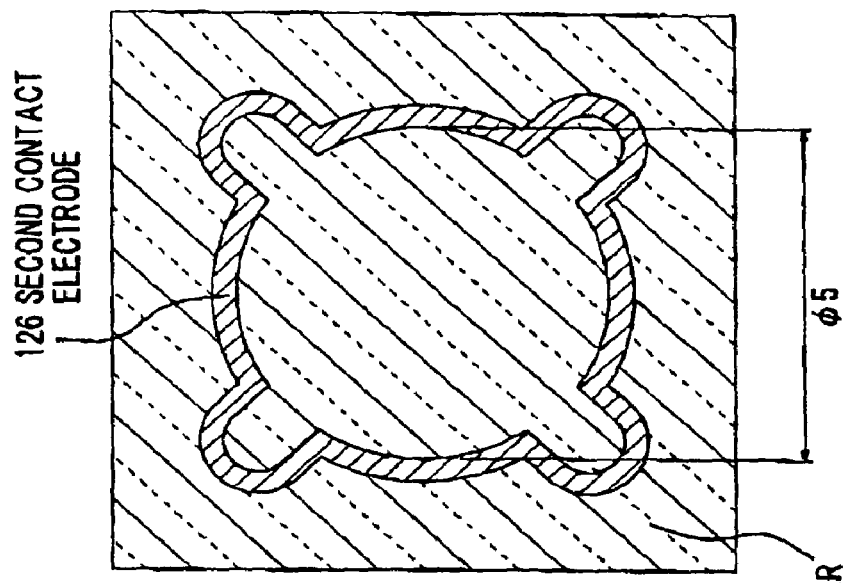
FIG. 13B is a sectional plan view of the light emitting device in the third variation.
Figure 13A:
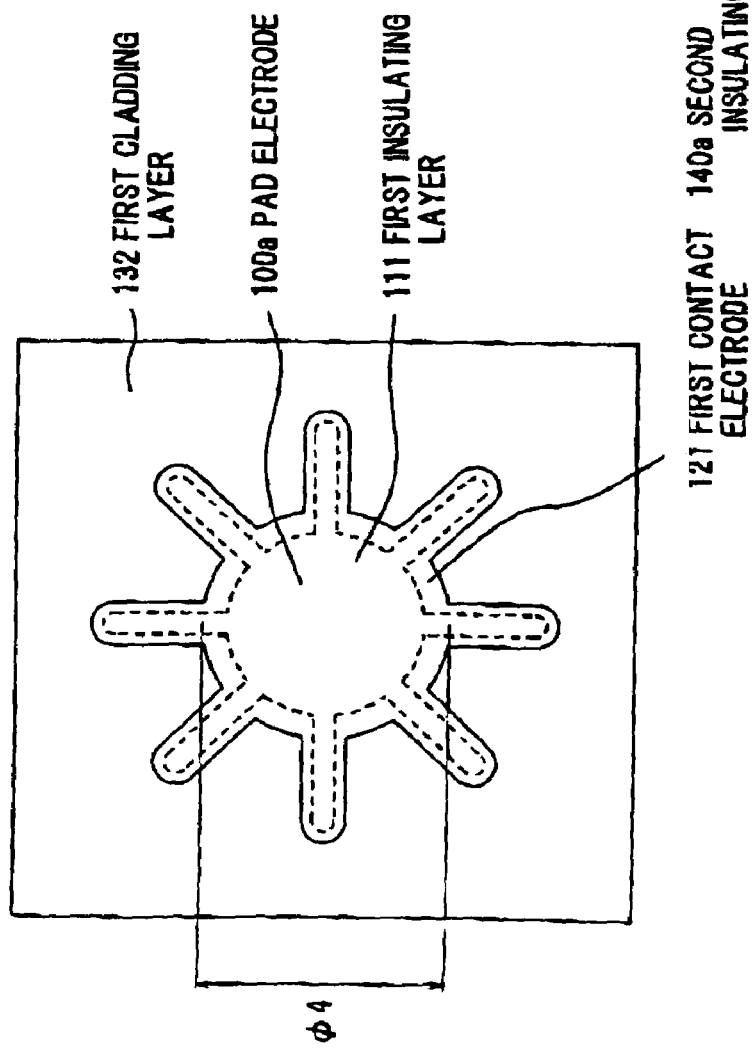
FIG. 13A is a plan view of a light emitting device in a third variation.

FIG. 13A is a plan view of a light emitting device in a third variation, and FIG. 13B is a sectional plan view of the light emitting device in the third variation.

A light emitting device in the third variation has a substantially similar configuration to the light emitting device 1 in the first preferred embodiment, except that configurations of the pad electrode and the first contact electrode as the upper electrode and a configuration of the second contract electrode. Therefore, detailed explanation thereof is omitted except the different point.

The pad electrode 100a of the light emitting device in the third variation comprises a circular portion with a predetermined diameter φ4 and a plurality of branch portions each having a predetermined line width. Each of the branch portions is formed to be extended from the circular portion toward each apex of the first cladding layer 132. To be concrete, the pad electrode 100a is formed on the first contact electrode 121 and the first insulating layer 111, as shown in FIG. 13A. The pad electrode 100a and the first contact electrode 121 are electrically connected to each other at the outer periphery of the pad electrode 100a.

A center of the pad electrode 100a is formed to substantially coincide with the center of the first cladding layer 132, and the first contact electrode 121 and the first insulating layer 111 are formed in a region right under the pad electrode 100a. As an example, the diameter φ4 of the circular portion of the pad electrode 100a is 100 μm, and a diameter of the outer periphery of the circular portion of the first contact electrode 121 is 100 μm. In addition, a width of the branch portion of the pad electrode 100a is about 20 μm, for example.

A groove provided in the second insulating layer 140a in the third variation is formed to have a similar shape to a shape of the outer periphery the pad electrode 100a or a shape of the outer periphery of the first contact electrode 121. To be concrete, the groove having a similar shape to that of the first contact electrode 121 and a dimension larger than that of the first contact electrode 121 is formed at the second insulating layer 140a. The second contact electrode 126 is formed by filling a predetermined metal material in the groove formed at the second insulating layer 140a. In the circular portion of the second contact electrode 126, an inner diameter $\phi 5$ is formed to be greater than the diameter $\phi 4$ of the circular portion of the pad electrode 100a.

[Fourth Variation]

Figure 14B:
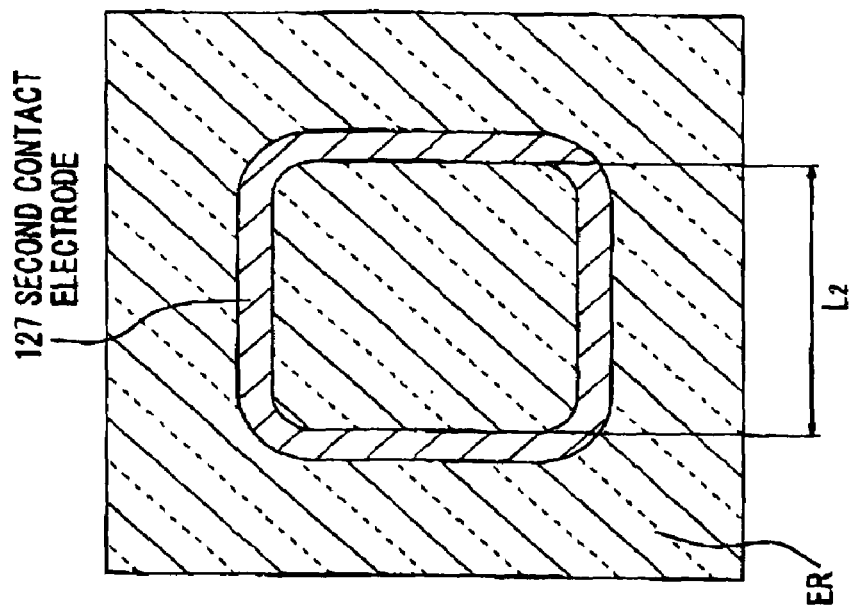
FIG. 14B is a sectional plan view of the light emitting device in the fourth variation.
Figure 14A:
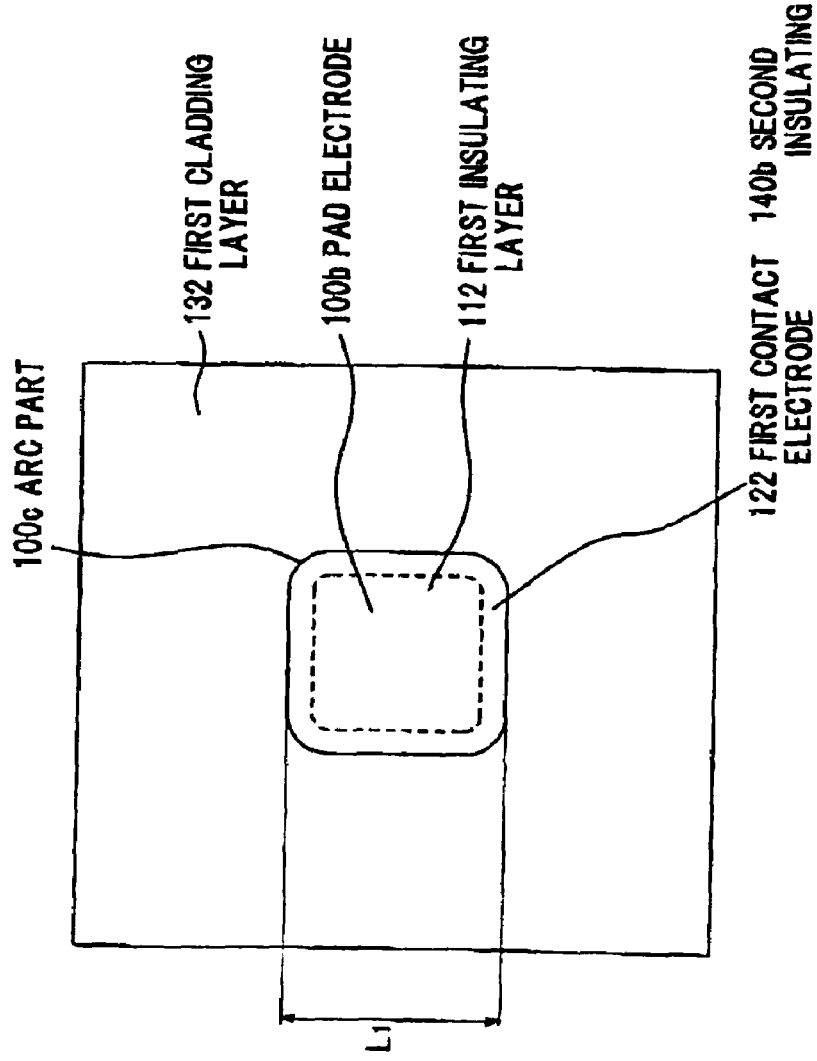
FIG. 14A is a plan view of a light emitting device in a fourth variation.

FIG. 14A is a plan view of a light emitting device in a fourth variation, and FIG. 14B is a sectional plan view of the light emitting device concerning the fourth variation.

A light emitting device in the fourth variation has a substantially similar configuration to the light emitting device 1 in the first preferred embodiment, except that configurations of the pad electrode and the first contact electrode as the upper electrode and a configuration of the second contract electrode. Therefore, detailed explanation thereof is omitted except the different point.

A pad electrode 100b of the light emitting device in the fourth variation comprises a part having one side with a predetermined length L1 and arc parts 100c with a predetermined curvature. To be concrete, the pad electrode 100b is formed on the first contact electrode 122 and the first insulating layer 112 as shown in FIG. 14A. In other words, the pad electrode 100b is formed to have a substantially square shape, and each apex (corner) is formed in a predetermined arc shape. The pad electrode 100b and the first contact electrode 122 are electrically connected to each other at the outer periphery of the pad electrode 100b. A center of the pad electrode 100b is formed to substantially coincide with a the center of the first cladding layer 132, and the first contact electrode 122 and the first insulating layer 112 are formed in a region right under the pad electrode 100b.

A groove provided in the second insulating layer 140b in the fourth variation is formed to have a similar shape to a shape of the outer periphery the pad electrode 100b or a shape of the outer periphery of the first contact electrode 122. To be concrete, the groove having a similar shape to that of the first contact electrode 122 and a dimension larger than that of the first contact electrode 122 is formed at the second insulating layer 140b. The second contact electrode 127 is formed by filling a predetermined metal material in the groove formed at the second insulating layer 140b. A length L2 of one side of an inner periphery of the second contact electrode 127 is formed to be greater than the length L1 of one side of the pad electrode 100b.

[Fifth Variation]

Figure 15A:
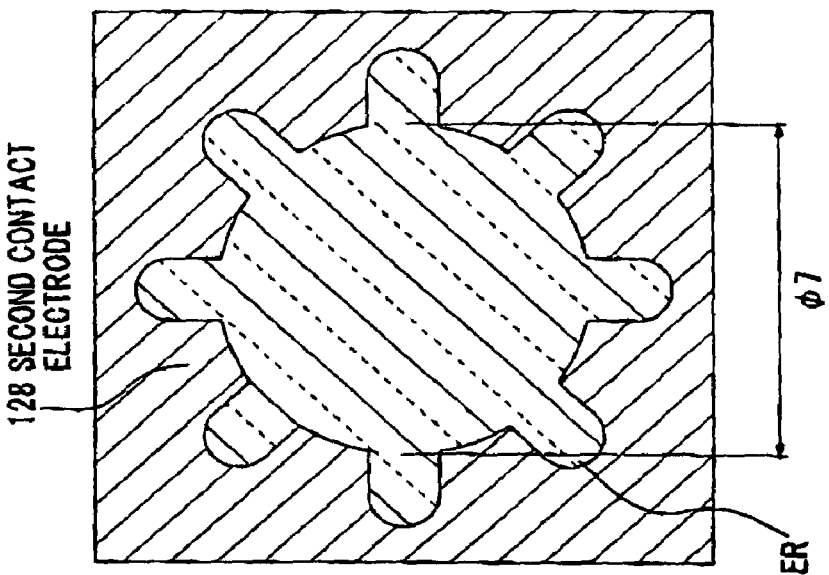
FIG. 15A is a plan view of a light emitting device in a fifth variation.
Figure 15B:
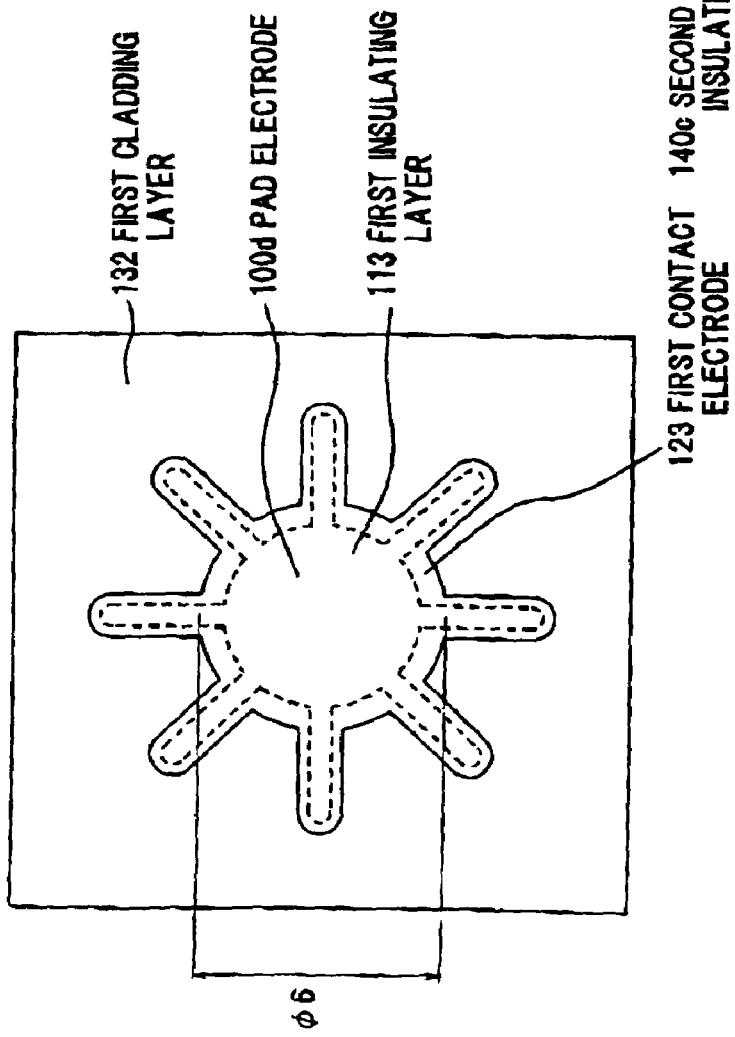
FIG. 15B is a sectional plan view of the light emitting device in the fifth variation.

FIG. 15A is a plan view of a light emitting device in a fifth variation, and FIG. 15B is a sectional plan view of the light emitting device in the fifth variation.

A light emitting device in the fifth variation has a substantially similar configuration to the light emitting device 1 in the first preferred embodiment, except that configurations of the pad electrode and the first contact electrode as the upper electrode and a configuration of the second contract electrode. Therefore, detailed explanation thereof is omitted except the different point.

A pad electrode 100d of the light emitting device in the fifth variation comprises a circular portion with a predetermined diameter $\phi 6$ and a plurality of branch portions each having a predetermined line width. Each of the branch portions is formed to be extended from the circular portion toward each apex (corner) of the first cladding layer 132 and each side of the first cladding layer 132. To be concrete, the pad electrode 100d is formed on the first contact electrode 123 and the first insulating layer 113, as shown in FIG. 15A. The pad electrode 100d and the first contact electrode 123 are electrically connected to each other at the outer periphery of the pad electrode 100d.

A center of the pad electrode 100d is formed to substantially coincide with the center of the first cladding layer 132, and the first contact electrode 123 and the first insulating layer 113 are formed in a region right under the pad electrode 100d. As an example, the diameter $\phi 6$ of the circular portion of the pad electrode 100d is 100 μm, and a diameter of the outer periphery of the circular portion of the first contact electrode 123 is 100 μm. In addition, a width of the branch portion of the pad electrode 100d is about 20 μm, for example.

A groove provided in the second insulating layer 140c in the fifth variation is formed to have a similar shape to a shape of the outer periphery the pad electrode 100d or a shape of the outer periphery of the first contact electrode 123. To be concrete, a predetermined region having a similar shape to that of the first contact electrode 123 and a dimension larger than that of the first contact electrode 123 is removed from the second insulating layer 140c. The second contact electrode 128 is formed by evaporating a predetermined metal material on the predetermined region from which the second insulating layer 140d is removed.

Namely, in the fifth variation, a contacting portion between the second contact electrode 128 and the second insulating layer 140c is formed to have a similar shape to a shape of the outer periphery the pad electrode 100d or a shape of the outer periphery of the first contact electrode 123. A diameter $\phi 7$ of the circular portion at the inner periphery of the second contact electrode 128 is formed to be greater than the diameter $\phi 6$ of the circular portion of the pad electrode 100d.

[Sixth Variation]

Figure 17:
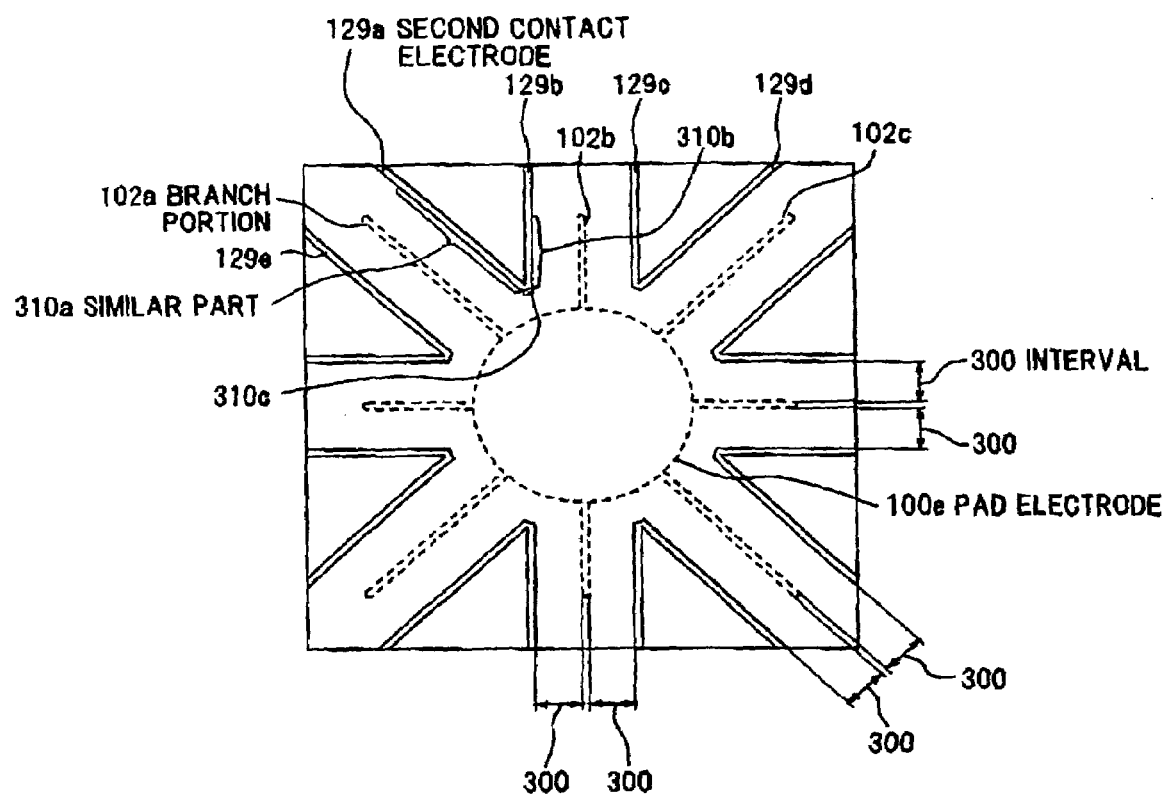
FIG. 17 is an explanatory diagram showing a location relationship of a pad electrode and second contact electrodes in a plan view of the light emitting device in the sixth variation.

FIG. 16A is a plan view of the light emitting device in a sixth variation, and FIG. 16B is a sectional plan view of the light emitting device in the sixth variation. FIG. 17 is an explanatory diagram showing a location relationship of a pad electrode and second contact electrodes in a plan view of the light emitting device in the sixth variation.

A light emitting device in the sixth variation has a substantially similar configuration to the light emitting device 1 in the first preferred embodiment, except that configurations of the pad electrode and the first contact electrode as the upper electrode and a configuration of the second contract electrode. Therefore, detailed explanation thereof is omitted except the different point.

A pad electrode 100e of the light emitting device in the sixth variation comprises a circular portion with a predetermined diameter and a plurality of branch portions (for example, branch portions 102a, 102b, 102c, and the like) each having a predetermined line width. Each of the branch portions is formed to be extended from the circular portion toward each apex (corner) of the first cladding layer 132 and each side of the first cladding layer 132, as shown in FIG. 16A. A center of the pad electrode 100e is formed to substantially coincide with the center of the first cladding layer 132. As an example, the diameter of the circular portion of the pad electrode 100e is about 100 μm, and a width of the branch portion of the pad electrode 100e is about 0.5 μm, for example. However, the diameter of the circular portion and the width of the branch portion are not limited to the above example. For example, the width of the branch portion is not less than 0.5 μm and not greater than 20 μm, more preferably, not less than 0.5 μm and not greater than 5 μm.

A groove provided in the second insulating layer 140d in the sixth variation comprises a part having a similar shape to that of at least one part of an outer periphery of a pad electrode 100e, and the groove is formed to have a linear shape. Each of the linear grooves provided in the second insulating layer 140d is formed at a position where the linear groove does not overlap with the pad electrode 100e in plan view as shown in FIG. 16B. For example, when the light emitting device in the sixth variation is viewed from the upper surface, a plurality of the grooves are formed at the second insulating layer 140d such that the second contact electrode 129a and the second contact electrode 129b are disposed between the branch portion 102a and the branch portion 102b.

The groove provided in the second insulating layer 140d is formed to have a width in which the second contact electrode having a desired width can be formed. As an example, the groove provided in the second insulating layer 140d has a width of 0.5 μm. A predetermined metal material is evaporated on a region in each of the grooves which is formed by removing the second insulating layer 140d, to provide second contact electrodes 129 (For example, second contact electrodes 129a, 129b, 129c, 129d, 129e, and the like). It is possible to reduce an absorption amount of the light emitted from the active layer 134 in the second contact electrode 129, by reducing the line width of the second contact electrode 129, thereby reducing a ratio of a total area of a plurality of the second contact electrodes 129 to an area of the first cladding layer 132 in plan view.

FIG. 17 shows the location relationship of the pad electrode 100e and the second contact electrodes in more concrete. When the light emitting device in the sixth variation is viewed from the upper surface, the linear second contact electrode 129a and the linear second contact electrode 129b are disposed between the branch portion 102a and the branch portion 102b. In other words, the second contact electrode 129a is disposed in substantially parallel with the branch portion 102a in plan view. Similarly, the second contact electrode 129b is disposed in substantially parallel with the branch portion 102b in plan view.

For this case, a part of the outer periphery of the second contact electrode 129a, which is in vicinity of an outer periphery of the branch portion 102a in plan view, is provided as a similar part 310a having a similar shape to that of one part of the outer periphery of the branch portion 102a. Similarly, a part of the outer periphery of the second contact electrode 129b, which is in vicinity of an outer periphery of the branch portion 102b in plan view, is provided as a similar part 310b having a similar shape to that of one part of the outer periphery of the branch portion 102b. Further, a part of the outer periphery of a contacting portion between the second contact electrode 129a and the second contact electrode 129b, which is in vicinity of an outer periphery of a contacting portion between the branch portion 102a and the branch portion 102b in plan view, is provided as a similar part 310c having a similar shape to that of one part of the outer periphery of the pad electrode 100e.

In the light emitting device in the sixth variation, a spacing between the second contact electrode and the branch portion in plan view is a substantially uniform distance (interval 300), respectively. For example, the spacing between the second contact electrode 129a and the branch portion 102a in plan view is substantially equal to the spacing between the second contact electrode 129e and the branch portion 102a in plan view. Similarly, the spacing between the second contact electrode 129b and the branch portion 102b in plan view is substantially equal to the spacing between the second contact electrode 129c and the branch portion 102b in plan view. Since the relationship between other second electrodes and other branch portions are similar to the above relationship, detailed description thereof is omitted.

[Seventh Variation]

Figure 19:
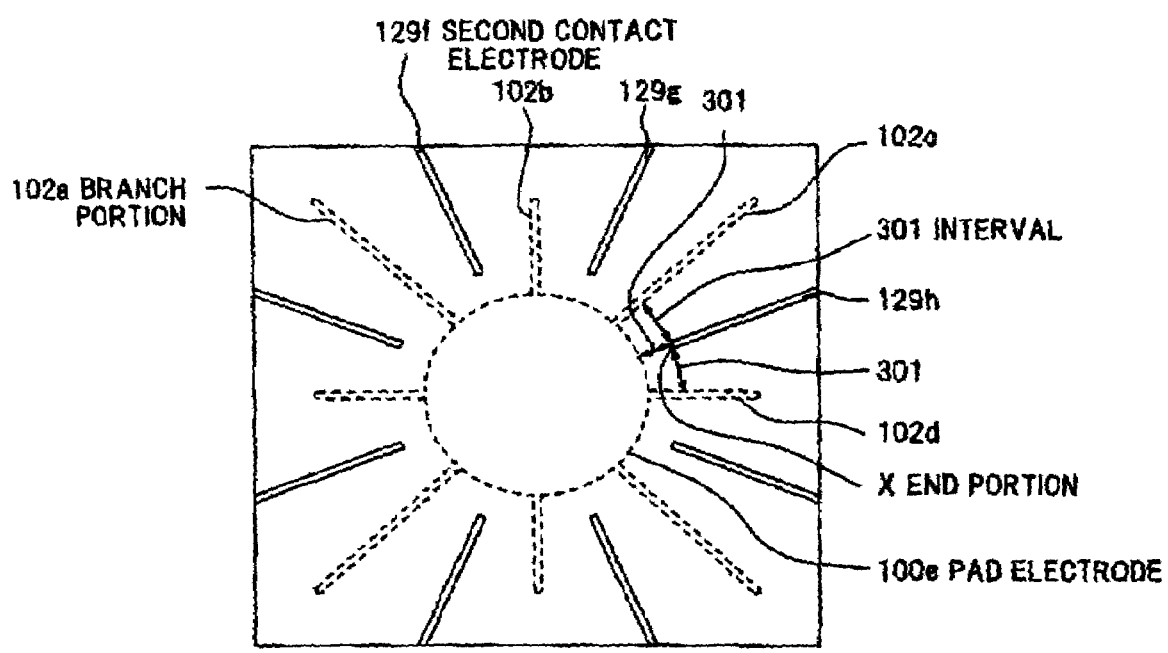
FIG. 19 is an explanatory diagram showing a location relationship of a pad electrode and second contact electrodes in a plan view of the light emitting device in the seventh variation.

FIG. 18A is a plan view of the light emitting device in a seventh variation, and FIG. 18B is a sectional plan view of the light emitting device in the seventh variation. FIG. 19 is an explanatory diagram showing a location relationship of a pad electrode and second contact electrodes in a plan view of the light emitting device in the seventh variation.

A light emitting device in the seventh variation has a substantially similar configuration to the light emitting device 1 in the first preferred embodiment, except that configurations of the pad electrode and the first contact electrode as the upper electrode and a configuration of the second contract electrode. Further, the pad electrode 100e as the upper electrode of the light emitting device in the seventh variation has a substantially similar structure to the pad electrode 100e of the light emitting device in the sixth variation. Therefore, detailed explanation thereof is omitted.

A groove provided in the second insulating layer 140e in the seventh variation is formed to have a linear shape from a position, in which a distance from at least one part of the outer periphery of the pad electrode 100e is substantially uniform in plan view, toward a predetermined direction. Each of the linear grooves provided in the second insulating layer 140e is formed at a position where the linear groove does not overlap with the pad electrode 100e in plan view as shown in FIG. 18B.

For example, when the light emitting device in the seventh variation is viewed from the upper surface, a groove is formed at the second insulating layer 140e such that a second contact electrode 129f is disposed between the branch portion 102a and the branch portion 102b. Similarly, another groove is formed at the second insulating layer 140e such that a second contact electrode 129g is disposed between the branch portion 102b and the branch portion 102c. In the second insulating layer 104e, a plurality of the grooves are formed such that one second electrode is disposed between the respective branch portions. Since the respective second electrodes are disposed similarly to the second contact electrode 129f, detailed description thereof is omitted.

As an example, the groove provided in the second insulating layer 140e has a width of 0.5 μm. A predetermined metal material is evaporated on a region in each of the grooves which is formed by removing the second insulating layer 140e, to provide second contact electrodes 129 (For example, second contact electrodes 129f, 129g, 129h and the like).

FIG. 19 shows the location relationship of the pad electrode 100e and the second contact electrodes in more concrete. When the light emitting device in the seventh variation is viewed from the upper surface, the linear second contact electrode 129f is disposed between the branch portion 102a and the branch portion 102b. Similarly, the linear second contact electrode 129g is disposed between the branch portion 102b and the branch portion 102c, and the linear second contact electrode 129h is disposed between the branch portion 102c and the branch portion 102d. Since other second electrodes are disposed similarly, detailed description thereof is omitted.

For this case, each of the second electrodes is formed such that a distance (interval 301) from the first branch portion and the second branch portion sandwiching the second contact electrode in plan view to an end portion X of the second contact electrode at a side of the pad electrode 100e is substantially equal to a distance (interval 301) from the end portion X of the second contact electrode to the outer periphery of the circular portion of the pad electrode 100e. For example, the interval 301 from the end portion X of the second contact electrode 129h to the outer periphery of the circular portion of the pad electrode 100e in plan view, the interval 301 from the end portion X to the branch portion 102c in plan view, and the interval 301 from the end portion X to the branch portion second branch portion 102d in plan view are substantially equal to each other. Since the relationship between other second electrodes and other branch portions are similar to the above relationship, detailed description thereof is omitted.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A light emitting device comprising:
   a semiconductor multilayer structure including a light emitting layer;
   an upper electrode formed on one surface of the semiconductor multilayer structure;
   an interface electrode formed at a region on another surface of the semiconductor multilayer structure except a region right under the upper electrode, the interface electrode having a center that coincides with a center of the upper electrode and at least a part having a similar shape to a shape of an outer periphery of the upper electrode;
   a current blocking layer formed at another region on said another surface of the semiconductor multilayer structure except the region where the interface electrode is formed, for transmitting a light emitted from the light emitting layer;
   a reflecting layer electrically connected to the interface electrode, for reflecting a light transmitted through the current blocking layer that is a part of the light emitted from the light emitting layer to a side of said one surface of the semiconductor multilayer structure; and
   an electrically conductive supporting substrate electrically connected to the semiconductor multilayer structure at an opposite side of the reflecting layer with respect to the semiconductor multilayer structure.

2. The light emitting device according to claim 1, wherein the upper electrode has a circular shape and the interface electrode has an annular shape.

3. The light emitting device according to claim 2, wherein the interface electrode having the annular shape has a ring-shape, and a center of the ring-shaped interface electrode coincides with a center of the upper electrode.

4. The light emitting device according to claim 3, wherein the upper electrode comprises:
   a pad electrode part having a circular shape or a polygonal shape;
   a contact electrode part electrically connected to the pad electrode part at its upper portion, and electrically bonded to said one surface of the semiconductor multilayer structure at its lower portion, for supplying a current to the light emitting layer, and
   the pad electrode part contacts to the semiconductor multilayer structure at a region except a region contacting to the contact electrode part.

5. The light emitting device according to claim 3, wherein the upper electrode comprises:
   a pad electrode part having a circular shape or a polygonal shape;
   a contact electrode part electrically connected to the pad electrode part at its upper portion, and electrically bonded to said one surface of the semiconductor multilayer structure at its lower portion, for supplying a current to the light emitting layer; and
   a current blocking layer covering said one surface of the semiconductor multilayer structure at a region except a region where the pad electrode part contacts to the contact electrode part, for transmitting the light emitted from the light emitting layer.

6. A semiconductor light emitting device comprising:
   a semiconductor multilayer structure including a light emitting layer;
   a ring-shaped upper electrode formed on one surface of the semiconductor multilayer structure;
   an electrically conductive supporting substrate provided on another surface of the semiconductor multilayer structure;
   a reflecting layer formed on a surface of the conductive supporting substrate at a side of the semiconductor multilayer structure; and
   a ring-shaped interface electrode formed concentrically with the ring-shaped upper electrode at an interface between said another surface of the semiconductor multilayer structure and the reflecting layer, and having a diameter greater than that of the ring-shaped upper electrode.

* * * * *